United States Patent [19]
Doi et al.

[11] Patent Number: 5,793,790
[45] Date of Patent: Aug. 11, 1998

[54] OPTICAL DEVICE

[75] Inventors: Masato Doi; Kazuhiko Nemoto, both of Kanagawa, Japan

[73] Assignee: Sony Corporation, Tokyo, Japan

[21] Appl. No.: 712,365

[22] Filed: Sep. 11, 1996

[30] Foreign Application Priority Data

Sep. 13, 1995 [JP] Japan .................. 7-235680

[51] Int. Cl.$^6$ .................................... G11B 7/12
[52] U.S. Cl. .................. 372/50; 257/80; 257/84; 257/85; 257/98; 369/109; 369/122
[58] Field of Search ................ 372/50, 99; 250/201.5, 250/216; 257/98, 80, 84, 85; 369/112, 109, 13, 122, 44.23, 44.14, 44.12

[56] References Cited

U.S. PATENT DOCUMENTS 5,101,389  3/1992  Ohuchida et al. .............. 250/201.5
5,293,038  3/1994  Kadowaki et al. .............. 250/201.5

FOREIGN PATENT DOCUMENTS

A-0 640 962   3/1995   European Pat. Off. .
A-0 671 734   9/1995   European Pat. Off. .
A-0 686 969  12/1995   European Pat. Off. .
2 274 740     8/1994   United Kingdom .
WO-A-95 18444 7/1995   WIPO .

OTHER PUBLICATIONS

Donald R. Scifres, et al., *Diode Laser for Both Transmitting and Receiving Signals*, Xerox Disclosure Journal, vol. 7, No. 4, Jul. 1982–Aug. 1982, pp. 237–238.

*Primary Examiner*—Rodney B. Bovernick
*Assistant Examiner*—Quyen Phan Leung
*Attorney, Agent, or Firm*—Hill & Simpson

[57] ABSTRACT

An optical device comprises a substrate, a light-emitting portion, and a plurality of light-receiving portions, the light-emitting portion and a plurality of light-receiving portions being closely laminated on the same substrate, wherein returned light obtained after light emitted from a resonator end face of the light-emitting portion has been reflected on an irradiated portion is received and detected near a confocal point by a plurality of light-receiving portions. In this optical device such as an optical pickup, the number of optical ssemblies can be reduced, an alignment for disposing optical assemblies can be simplified, the whole of the optical device can be simplified and miniaturized, and a stable tracking servo can be effected by effectively utilizing advantages of a push-pull method.

8 Claims, 26 Drawing Sheets

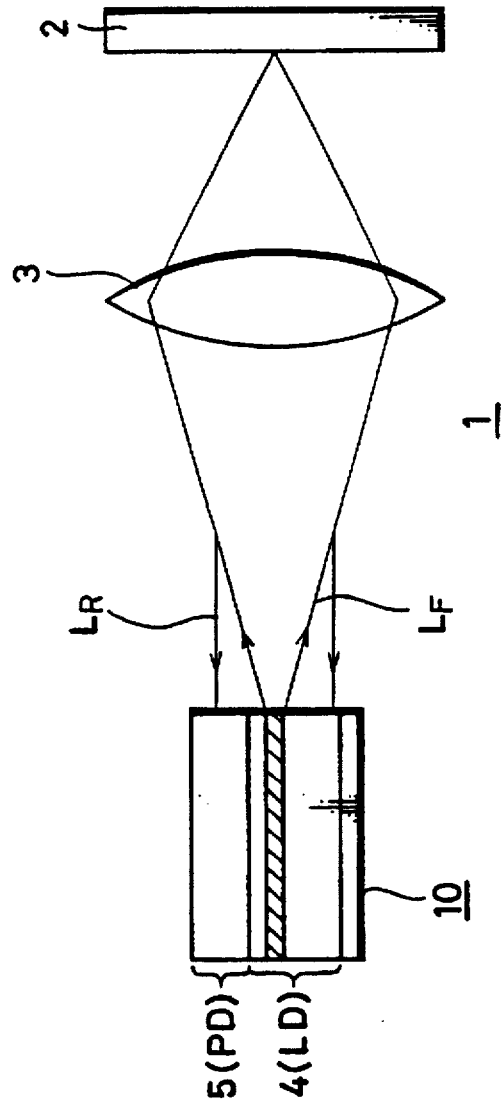
F I G. 2A
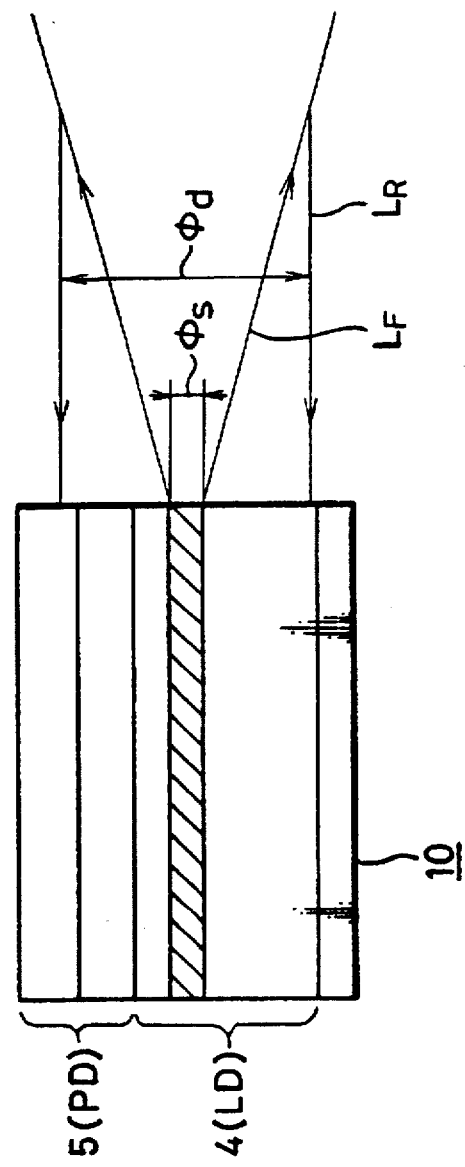
F I G. 2B

OPTICAL DEVICE

BACKGROUND OF THE INVENTION

The present invention relates to an optical device for use in receiving and detecting reflected-back light or returned light obtained from an irradiated portion after the irradiated portion of an optical recording medium such as an optical disk or a magneto-optical disk has been irradiated with light from a light-emitting portion.

In optical device, e.g., optical pickup of optical disk drive or magneto-optical disk drive for so-called compact disc (CD), optical assemblies such as a grating or beam splitter are fabricated individually so that the overall arrangement of optical device becomes complicated and large. Also, a very strict alignment accuracy is required in order to optically set the layout of the optical assemblies when the optical assemblies are fabricated on a substrate in a hybrid fashion.

FIG. 1 of the accompanying drawings is a schematic view illustrative of reflection and diffraction of light in which incident light and reflected light are illustrated across a reflection point on a recording medium, e.g., an optical disk. As shown in FIG. 1, in an ordinary optical pickup 80, incident light $L_F$ converged by an objective lens 81 is introduced into a recording pit of an optical recording medium, e.g., optical disk 82, wherein it is reflected and diffracted to provide three spots of zero-th order diffracted light, +first-order diffracted light and −first-order diffracted light, thereby forming reflected light $L_R$. These diffracted lights interfere with each other to change a light intensity of a far field pattern of the reflected light $L_R$ from the optical disk 82, which is used to reproduce a signal recorded on the optical disk.

A push-pull method is known as one of tracking servo methods. According to the push-pull method, when a beam spot of incident light is displaced from a track or pit on a disk, a difference of light intensity occurs between the +first-order diffracted light and −first-order diffracted light so that the far field pattern becomes asymmetrical. Therefore, two detectors A and B shown in FIG. 1 detect signals corresponding to the asymmetry of the far field pattern and a calculator calculate these signals to detect a displacement of beam spot.

When the tracking servo signal is detected by the aforementioned push-pull method, optical assemblies should be fabricated with a high alignment accuracy and margins in which a lens can be moved laterally or a disk can be skewed are small.

There is known a three-beam spot method as a method of detecting a tracking servo signal. In this case, light should be passed through a diffraction grating (grating, etc.), and when recorded information is reproduced, a light coupling efficiency obtained in detecting an RF (high-frequency) signal is decreased.

When light is returned to a light-emitting portion and returned light is received and detected, light should be splitted by a beam splitter or a hologram so that an amount of light received at a light-receiving portion is decreased.

In view of the aforesaid aspects, in order to reduce the number of optical assemblies, simplify the alignment for setting an optical layout, simplify the overall arrangement of the apparatus and to miniaturize the apparatus, there is propose a so-called CLC (confocal laser diode coupler) in which a light-emitting portion is located at the confocal position of a converging means such as a lens and a light-receiving portion is formed near the confocal position at which the light-emitting portion is disposed.

With the above-mentioned CLC arrangement, when there is provided one detector, for example, a tracking servo cannot be achieved. When a surface emission laser is used as a light-emitting portion, characteristics and reliability of such semiconductor laser are not satisfactory. Furthermore, when the CLC is produced by a semiconductor process, an unevenness of a semiconductor substrate exerts a large influence so that the CLC is difficult to be manufactured.

SUMMARY OF THE INVENTION

In view of the aforesaid aspect, it is an object of the present invention to provide an optical device in which the number of optical assemblies can be reduced and in which an alignment for setting an optical layout can be simplified.

It is another object of the present invention to provide an optical device of CLC arrangement in which an overall arrangement of the device can be simplified and miniaturized.

It is a further object of the present invention to provide an optical device in which characteristics of a semiconductor laser are satisfactory and which can be easily produced by a semiconductor process.

According to a first aspect of the present invention, there is provided an optical device which is comprised of a substrate, a light-emitting portion, and a plurality of light-receiving portions, the light-emitting portion and a plurality of light-receiving portions being closely laminated on the same substrate, wherein returned light obtained after light emitted from a resonator end face of the light-emitting portion has been reflected on an irradiated portion is received and detected near a confocal point by a plurality of light-receiving portions.

According to a second aspect of the present invention, there is provided an optical device which is comprised of a substrate, a first cladding layer, an active layer, a second cladding layer, the first cladding layer, the active layer and the second cladding layer being laminated on the substrate in that order, and a plurality of light-receiving elements laminated on the second cladding layer, wherein a plurality of light-receiving elements are located near confocal point of light emitted from the active layer and a plurality of light-receiving elements detect a tracking servo signal.

In accordance with a third aspect of the present invention, there is provided an optical device which is comprised of an optical element including a light-emitting portion and a plurality of light-receiving portions closely laminated on the same substrate, an irradiated portion, and converging means disposed between, the light-emitting portion and the irradiated portion, wherein light emitted from the light-emitting portion is converged by the converging means, reflected by the irradiated portion, again converged by the converging means and returned to the optical element and light returned to the optical element is introduced into the light-emitting portion of the optical element and a region including at least a part of the light-receiving portions.

According to the present invention, the optical device is arranged such that returned light obtained after light emitted from a resonator end face of the light-emitting portion has been reflected on an irradiated portion is received and detected near a confocal point by a plurality of light-receiving portions laminated on the same substrate together with the light-emitting portion, i.e., the optical device is of a CLC (confocal laser coupler) type. At that time, since there are provided a plurality of light-receiving portions, the position at which the irradiated portion is irradiated with light incident on the irradiated portion, i.e., light emitted from the light-emitting portion can be detected (tracking servo can be effected).

BRIEF DESCRIPTION OF THE DRAWINGS

FIG 2A is a schematic diagram showing a confocal optical system to which the present invention is applied;

FIG. 2B is a diagram showing an optical device shown in FIG. 2A in an enlarged scale;

DETAILED DESCRIPTION OF THE PREFERRED EMBODIMENTS

Figure 1:
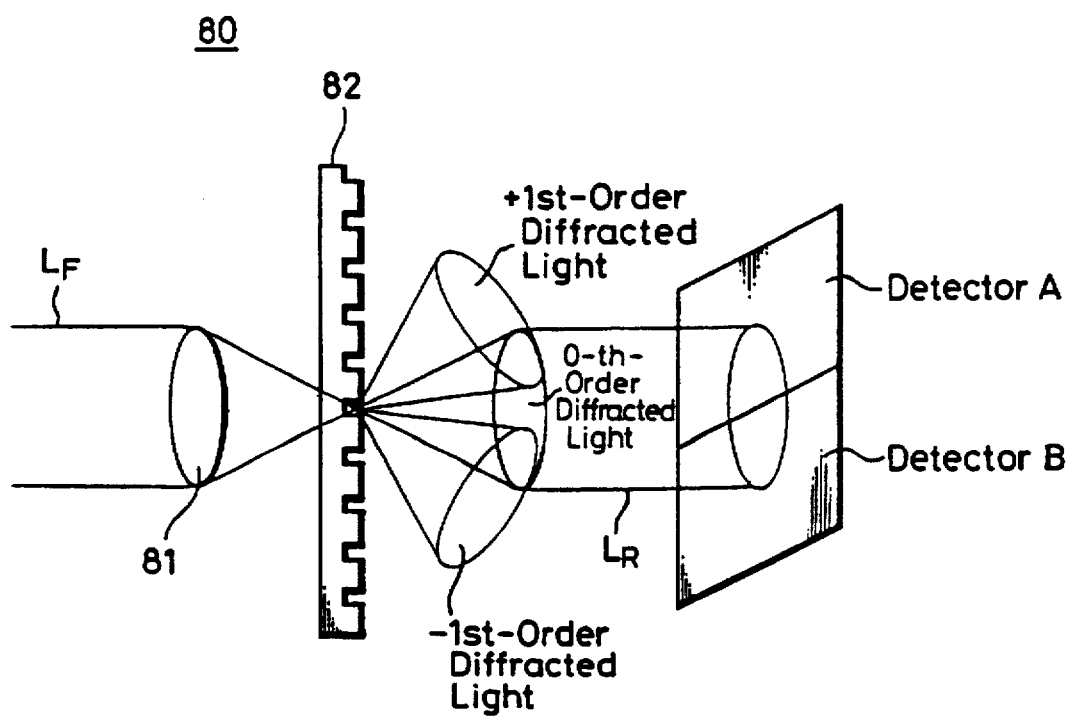
FIG. 1 is a schematic diagram illustrating reflection and diffraction of light according to an optical system.

The present invention will now be described with reference to the drawings.

An optical device according to the present invention may be applied to the aforementioned CLC arrangement in which a light-receiving portion is formed just above or just under a light-emitting portion formed of a semiconductor laser for detecting a tracking servo signal by a push-pull method.

Initially, the manner in which the present invention is applied to an optical system, i.e., confocal optical system of an optical pickup for reading recorded information from a recording medium, e.g., optical disk will be described.

FIG. 2A is a schematic diagram showing a confocal optical system to which the present invention is applied. An optical system, generally depicted by reference numeral 1 in FIG. 2A, comprises a converging means 3 such as an objective lens, a light-emitting portion 4 formed of a semiconductor laser LD and a light-receiving portion 5 such as a photodiode PD. As shown in FIG. 2A, the light-emitting portion 4 and the light-receiving portion 5 are monolithically laminated on the same semiconductor substrate, thereby an optical device 10 being formed.

Light $L_F$ from the light-emitting portion 4 is converged and irradiated on an irradiated portion 2 such as an optical disk by the converging means 3. Returned light (reflected-back light) $L_R$ from the irradiated portion 2 travels through the same light path before and after it is reflected at the irradiated portion 2, i.e., the light path of the same optical axis as that of the emitted light $L_F$, is converged again by the converging means 3 and received at the light-receiving portion 5. The light-receiving portion 5 is disposed near the confocal position concerning the returned light $L_R$ returned from the irradiated portion 2 through the converging means 3.

The returned light $L_R$ is-converged in the vicinity of light diffraction limit (i.e., diffraction limit of lens) by the converging means 3. The light-receiving portion 5 is disposed such that a part of light-receiving surface is located within this light diffraction limit, i.e., a distance from the optical axis of the emitted light $L_F$ from the light-emitting portion 4 falls within $0.61\lambda/NA$ of ½ of $1.22\lambda/NA$ which is a light diffraction limit where $\lambda$ represents the wavelength of the light emitted from the light-emitting portion 4 and NA represents the numerical aperture of the converging means 3, resulting in the aforementioned CLC arrangement being formed.

FIG. 2B illustrates the optical device 10 shown in FIG. 2A in an enlarged scale. In FIG. 2B, a diameter $\phi_s$ of the emitted light $L_F$ received on the light-receiving surface of the light-receiving portion 5 from the light-emitting portion 4 is smaller than a diameter $\phi_d$, whereby the effective light-receiving surface of the light-receiving portion 5 is located outside the diameter $\phi_s$ of the emitted light $L_F$.

If a semiconductor laser is used as a light source for the light-emitting portion 4, then the diameter $\phi_m$ of the emitted light can fall within a range of from about 1 to 2 μm. If the numerical aperture NA of the converging means 3, for example, ranges from 0.09 to 0.1 and the wavelength $\lambda$ of the emitted light is about 780 nm, then a distance ($\phi_F/2$) from the optical axis of the emitted light $L_F$ in the diffraction limit becomes about 0.61λ/NA=5 μm.

The optical device according to the present invention can detect a tracking servo signal by a plurality of light-receiving portions 5 located near the confocal position according to the push-pull method as will be described later on.

An optical device according to a first embodiment will be described.

Figure 3:
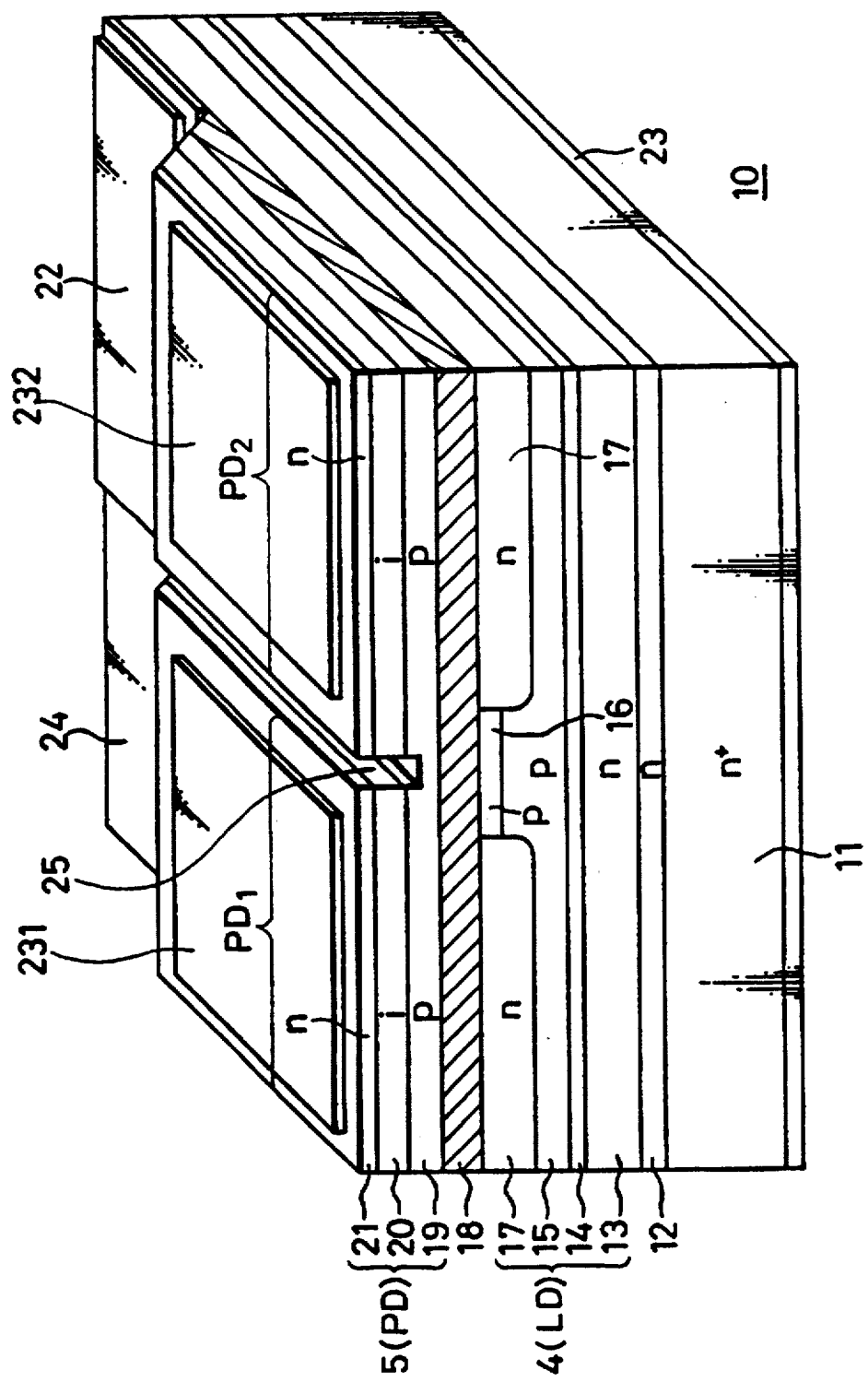
FIG. 3 is a perspective view illustrating an optical device according to a first embodiment of the present invention.

FIG. 3 is a perspective view illustrating an optical device according to a first embodiment (hereinafter referred to as "inventive example 1") according to the present invention.

In this embodiment, a light-receiving portion is laminated just above a light-emitting portion.

A first cladding layer, an active layer and a second cladding layer are laminated on a substrate, in that order. A plurality of light-receiving devices are laminated on the second cladding layer and these light-receiving devices are located near the confocal position of light emitted from the active layer thereby to detect a tracking servo signal.

This optical device includes the optical element 10 of the optical device with the confocal optical system shown in FIGS. 2A and 2B formed thereon, and the optical element 10 includes a substrate 11 on which there are laminated a light-emitting portion 4 formed of a semiconductor laser LD having a resonator length direction in the direction along the substrate surface and a light-receiving portion 5 composed of two photodiodes PD ($PD_1$, $PD_2$) formed just over the light-emitting portion 4.

The optical element 10 includes a first conductivity-type, e.g., n-type GaAs substrate 11 heavily-doped with impurity whose major surface is {100} crystal plane on which an n-type GaAs buffer layer 12, a n-type AlGaAs first cladding layer 13, an i-type GaAs (intrinsic GaAs) active layer 14, a second conductivity-type, i.e., p-type AlGaAs second cladding layer 15 and a second conductivity-type, i.e., p-type GaAs capping layer 16 are epitaxially deposited by a proper method such as MOCVD (metal organic chemical vapor deposition).

A first conductivity-type, e.g., n-type GaAs current confinement layer 17 is formed on the second cladding layer 15, thereby forming the light-emitting portion 4, i.e., the semiconductor laser LD having a slab-waveguide horizontal resonator.

The two light-receiving portions 5, i.e., PIN-type photodiodes PD ($PD_1$, $PD_2$) composed of a second conductivity-type, i.e., p-type GaAs first semiconductor layer 19, an i-type GaAs second semiconductor layer 20 and a first conductivity-type, i.e., n-type GaAs third semiconductor layer 21 are epitaxially deposited just above the semiconductor laser LD through a p-type GaAs light-absorption layer 18 heavily-doped with impurity for absorbing direct light from the semiconductor laser LD in such a manner that a pin junction surface is not only in parallel to the horizontal resonator direction of the semiconductor laser LD but is perpendicular to the resonator end face, thereby the optical element being formed. Surfaces in which the photodiodes $PD_1$, $PD_2$ oppose the resonator end face become the light-receiving surfaces.

The light-absorption layer 18 has a bandgap equal to or smaller than that of the active layer 15 and blocks light other than returned light thereby to prevent a crosstalk from being caused between the semiconductor laser LD and the photodiode PD.

The light-absorption layer 18 and the semiconductor layers 19 to 21 of the light-receiving portion 5 are formed on the semiconductor laser LD of the light-emitting portion 4 except a part of the semiconductor laser LD. A p-side electrode 22 serving as both p-side electrode of the semiconductor laser LD and a p-side electrode of the photodiode PD is formed on the semiconductor laser LD at its left surface covering a part of the surface of the semiconductor laser LD. On the other hand, n-side electrodes 231, 232 of the photodiodes $PD_1$, $PD_2$ are formed on the third semiconductor layer 21 and an n-side electrode 23 of the semiconductor laser LD is formed on the lower surface of the semiconductor substrate 11.

A groove 25 is formed at the center of the first semiconductor layer 19, the second semiconductor layer 20 and the third semiconductor layer 21 constructing the light-receiving portion 5 by a suitable method such as etching, and the groove 25 divides the light-receiving portion 5 to provide the two photodiodes $PD_1$, $PD_2$.

Accordingly, the two photodiodes $PD_1$ and $PD_2$ are disposed in parallel to each other such that the pin junction end faces thereof are opposed to the resonator end face of the semiconductor laser LD.

The returned light $L_R$ is converged near the light diffraction limit by the converging means 3 and the light-receiving portion 5 is disposed such that at least a part of the light-receiving surface of the photodiodes $PD_1$, $PD_2$ is located at the position within the light diffraction limit.

The manner in which the tracking signal is detected in this optical device will be described.

Figure 4:
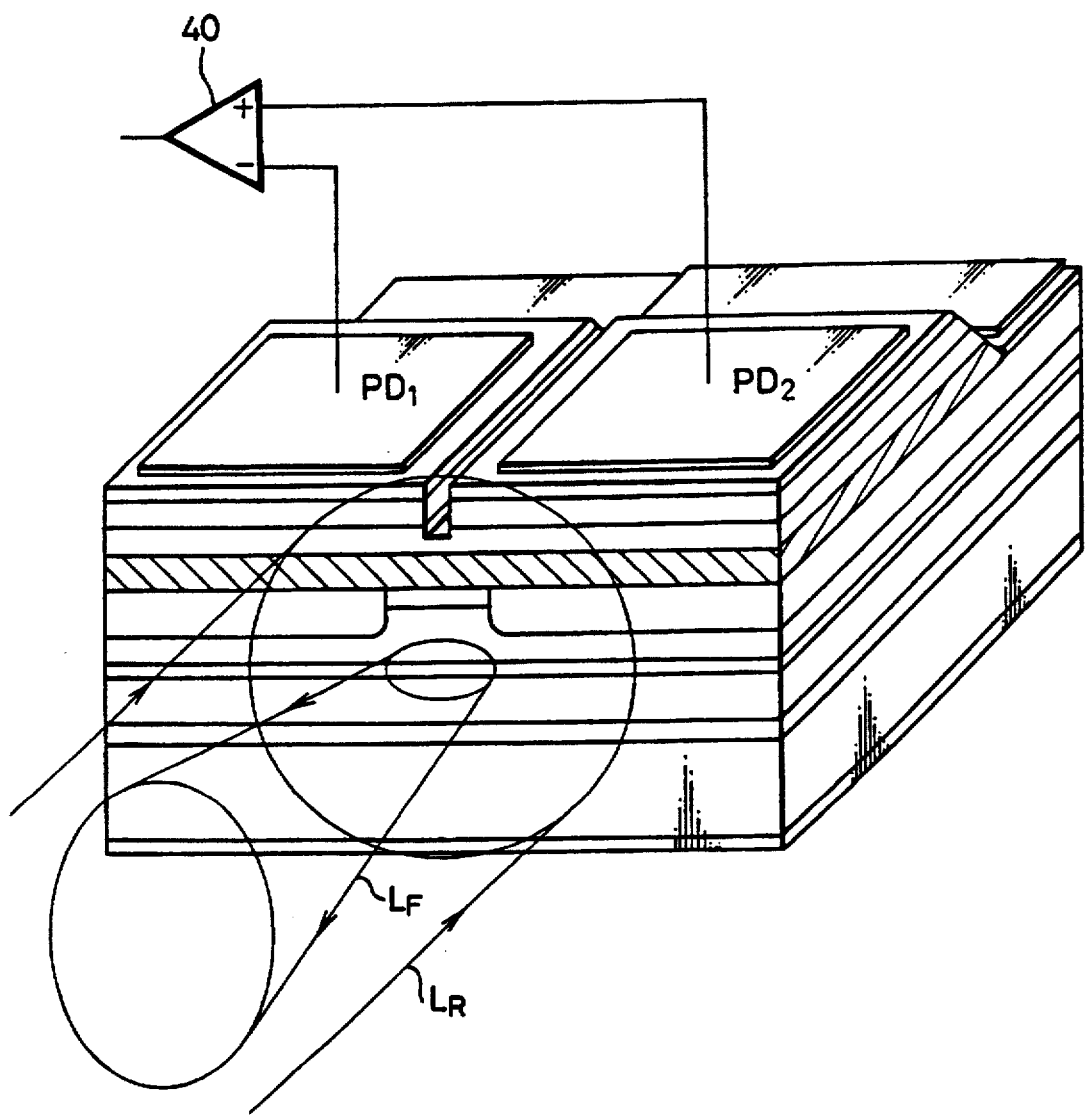
FIG. 4 is a perspective view illustrating a manner in which the optical device shown in FIG. 3 detects a signal.

As shown in FIG. 4, laser beam is emitted from the semiconductor laser LD of the light-emitting portion 4 and the emitted light $L_F$ generates the returned light $L_R$ from the irradiated portion 2. The returned light $L_R$ is received by the bisectioned photodiodes $PD_1$ and $PD_2$ constructing the light-receiving portion 5.

Then, a differential amplifier 40, for example, detects a tracking servo signal by use of the signals received at these photodiodes $PD_1$ and $PD_2$ according to the push-pull method.

A manner in which the confocal optical system detects the tracking servo signal by the push-pull method will be described below.

Figure 5:
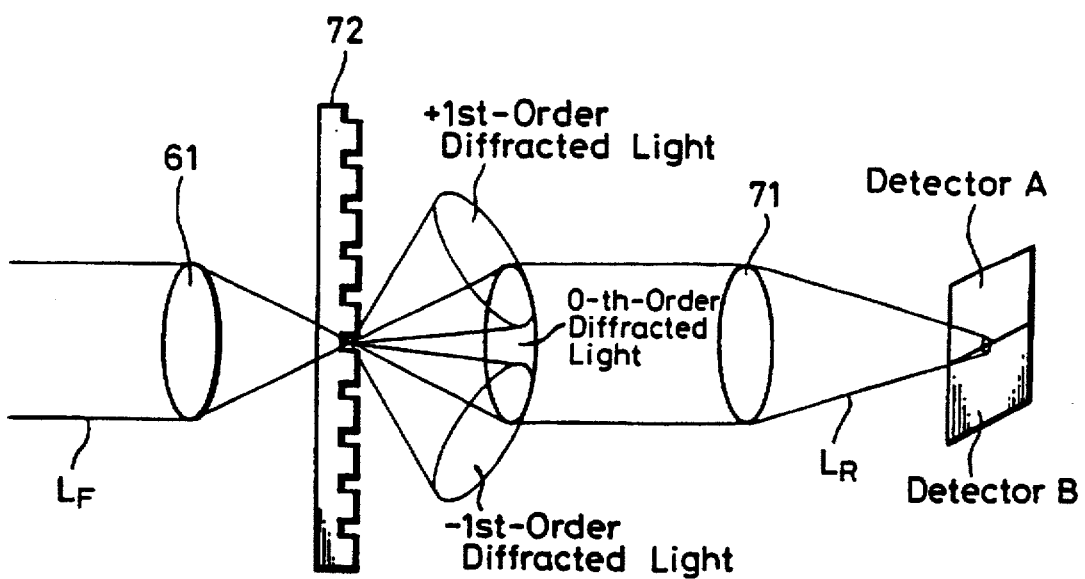
FIG. 5 is a schematic diagram illustrating reflection and diffraction of light in the optical system to which the present invention is applied.

FIG. 5 is a schematic diagram showing a light path in which a light path of incident light and a light path of reflected light are disposed across a reflection point on a recording medium, e.g., optical disk. As shown in FIG. 5, in an optical pickup 70 to which the present invention is applied, incident light $L_F$ converged through an objective lens 71 is introduced into a recording pit of an optical recording medium, e.g., optical disk 72, whereafter it is reflected and diffracted to provide zero-th order diffracted light, +first-order diffracted light and –first-order diffracted light, thereby forming reflected light $L_R$ similarly to FIG. 1. These diffracted lights interfere with each other to change a light intensity of a far field pattern based on the reflected light $L_R$ returned from the optical disk 72.

This optical device includes a plurality of detectors similarly to FIG. 1, e.g., the detector A and the detector B. These detectors A and B are disposed at the focal position in which the reflected light $L_R$ is converged and focused by the converging means such as the objective lens 71, i.e., near the confocal, thereby forming the confocal optical system as shown in FIG. 5.

As compared with the case shown in FIG. 1, beam spots of the reflected light $L_R$ irradiated on the detectors A and B are converged and made small so that the tracking servo signal can be detected by smaller detectors.

The push-pull method detects the tracking servo signal by generating light, reflected and diffracted by the tracking guide groove on the optical disk at its irradiated portion as an output difference from the two light-receiving portions on the bisectioned photodiodes PD disposed symmetrically.

Figure 6A:
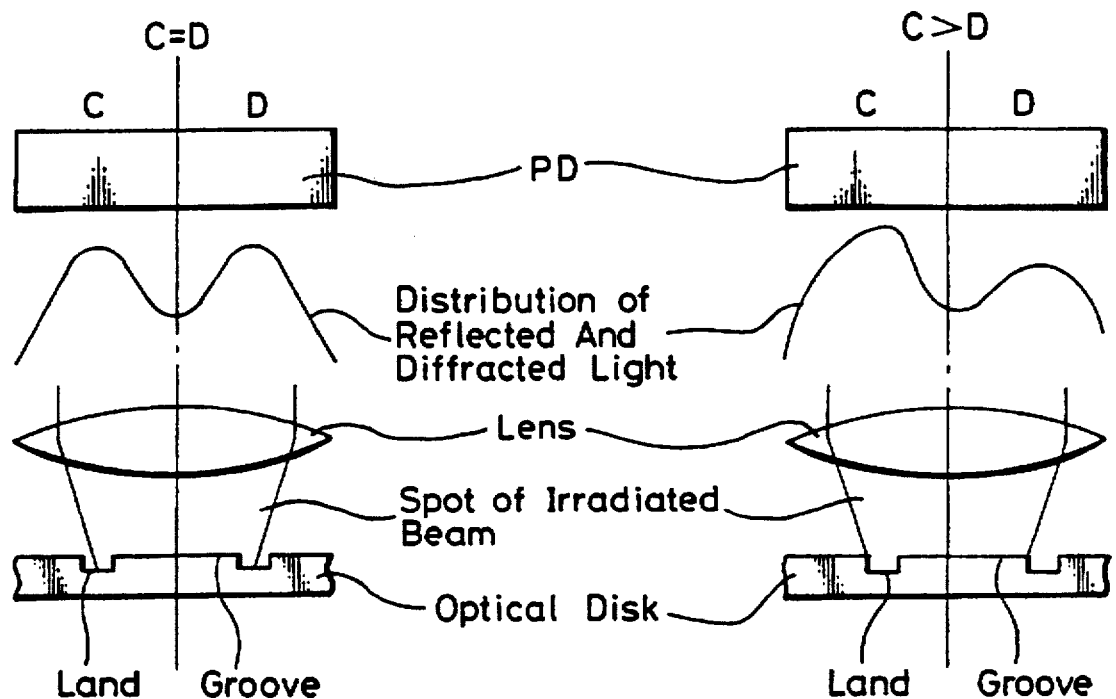
FIGS. 6A and 6B are schematic diagrams showing a relationship between an irradiated position of an irradiated spot on an optical disk and distributions of reflected light and diffracted light.
Figure 6B:
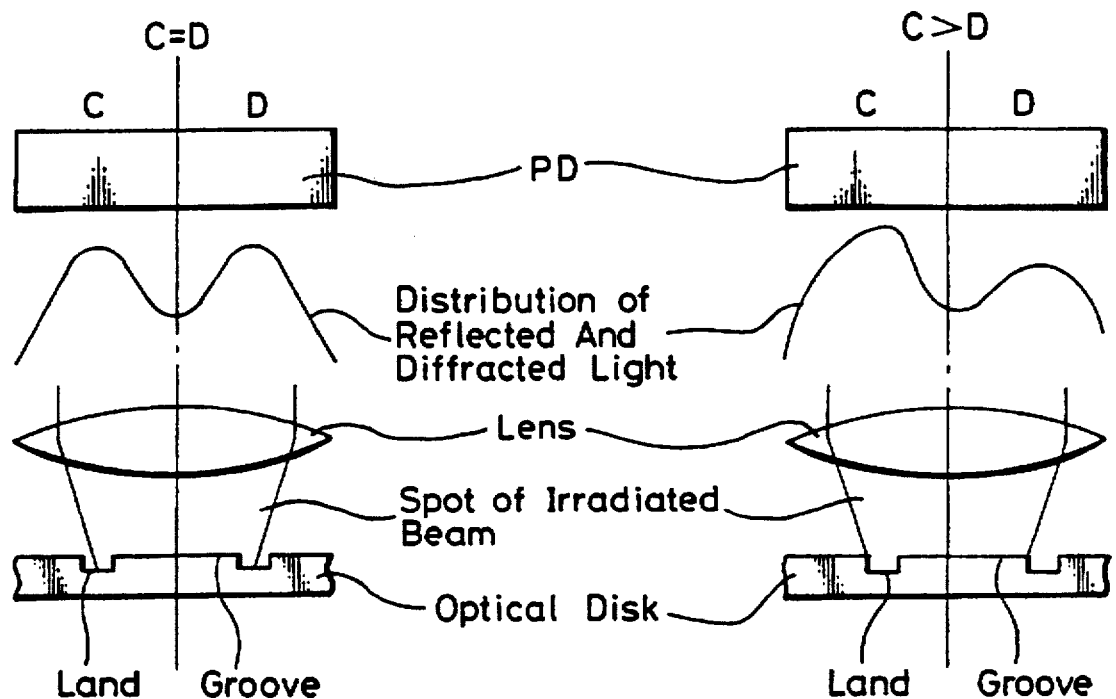

FIGS. 6A and 6B schematically show a relationship between the position of the irradiated spot on the optical disk and a distribution of reflected and diffracted light. When the center of the irradiated spot and the center of the guide groove (groove portion) agree with each other, as shown in FIG. 6A, there can be obtained a symmetrical reflected and diffracted light distribution wherein intensities of lights received at the two photodiodes PD (C, D) agree with each other (C=D). When the center of the irradiated spot and an intermediate portion between the guide grooves agree with each other, similarly to FIG. 6A, there can be obtained a symmetrical reflected and diffracted light distribution wherein intensities of lights received by the two PDs are coincident with each other. On the other hand, as shown in FIG. 6B, when the center of the irradiated spot is not coincident with the center of the groove portion and the land portion, there is obtained an asymmetrical diffracted light distribution wherein intensities of lights received at the two photodiodes PD (C, D) are not coincident with each other.

Figure 6C:
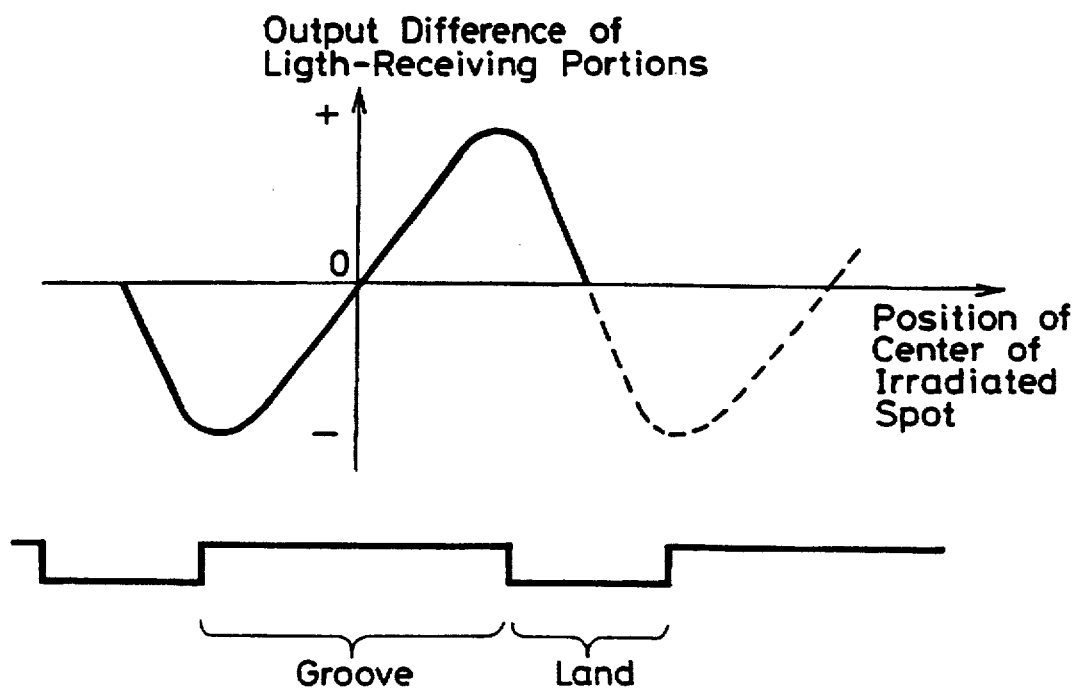
FIG. 6C is a diagram showing a relationship between the position of the center of the irradiated spot and an output difference of a light-receiving portion.

As a result, as shown by the relationship between the position of the center of the irradiated spot and the output difference between the light-receiving portions in FIG. 6C, the difference between the outputs from the two light-receiving portions when the irradiated spot crosses the track becomes an S-like curve.

Figure 7:
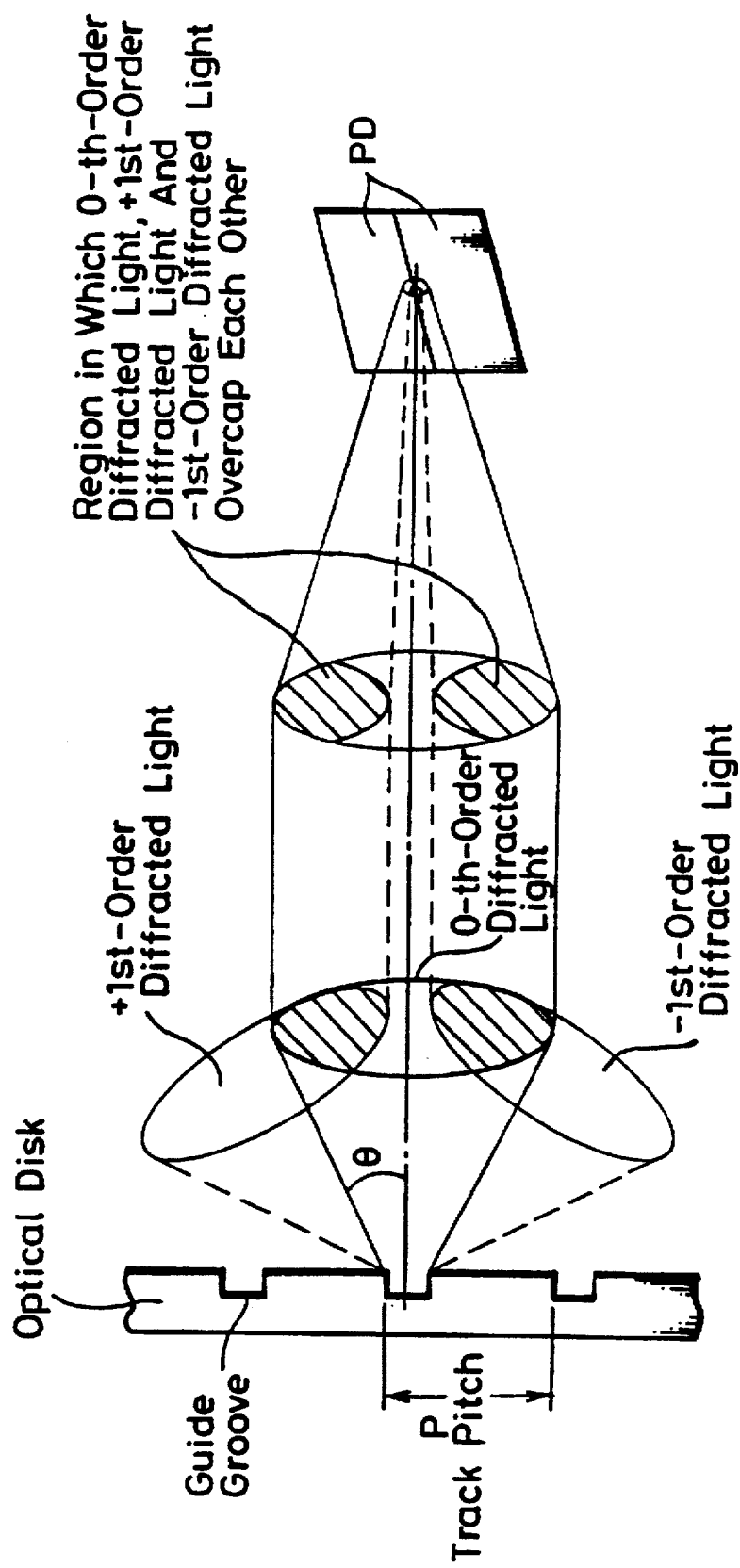
FIG. 7 is a schematic diagram of reflected and diffracted light from an optical disk.

The above-mentioned detection operation will be described more in detail with reference to FIG. 7 which is a schematic diagram showing reflected and diffracted light from an optical disk. When a track pitch P becomes equal to a beam spot in size, the guide groove looks like the diffraction grating. Specifically, at that time, phases of lights are overlapped in the direction in which $P\sin\theta=N\lambda$ (N is an integer), resulting in a light intensity being increased. Specifically, in the region in which the zero-th order diffracted light, the +first-order diffracted light and the –first-order diffracted light are overlapped, the intensity distribution of beam spot is changed due to interference effect caused by the displacement of track. Therefore, if the detectors comprising the bisectioned photodiodes PD are disposed in the above-mentioned region to detect a difference between outputs from these detectors, then it is possible to detect the tracking servo signal. At that time, the intensity of the tracking servo signal becomes highest when the depth of the guide groove is $\lambda/8n$. When the depth of the guide groove is $\lambda/4n$, interfering diffracted lights are canceled each other out so that the intensity becomes zero.

The optical device according to the inventive example 1 uses the differential amplifier 40 to generate a difference signal of a signal from the photodiode $PD_1$ and a signal from the photodiode $PD_2$, i.e., a signal $(PD_2-PD_1)$ as a tracking servo detecting signal.

Furthermore, it is possible to read information recorded on the optical disk, i.e., to detect the RF signal by use of an added signal of signals from the two photodiodes $PD_1$ and $PD_2$, e.g., $(PD_1+PD_2)$ as a detected signal.

A method of manufacturing the optical device according to the inventive example 1 will be described.

Figure 8A:
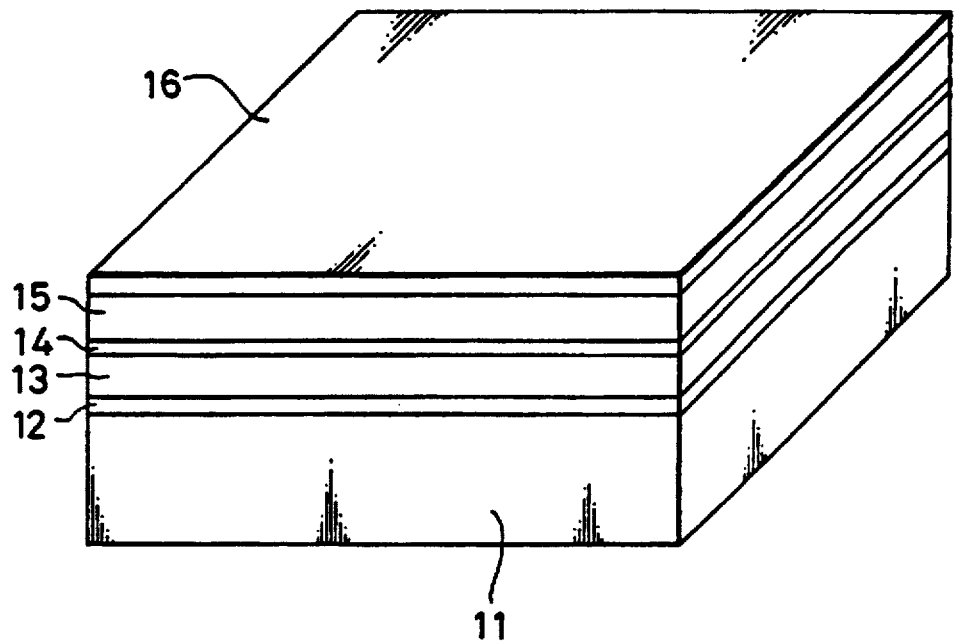
FIGS. 8A through 8L are process diagrams for manufacturing the optical device shown in FIG. 3.

As shown in FIG. 8A, there is prepared a first conductivity-type, e.g., n-type GaAs semiconductor substrate 11 heavily-doped with impurity whose major surface is {100} crystalline surface. On this semiconductor substrate 11, there are epitaxially deposited semiconductor layers constructing a semiconductor laser LD. Specifically, there are formed laminated semiconductor layers in which an n-type GaAs buffer layer 12 which is the same conductivity type as that of the semiconductor substrate 11, an n-type AlGaAs first cladding layer 13, an AlGaAs active layer 14, a second conductivity-type different from that of the first cladding layer 13, i.e., p-type AlGaAs second cladding layer 15 and a second conductivity-type, i.e., p-type GaAs capping layer 16 are epitaxially deposited in that order by MOCVD or the like.

Figure 8B:
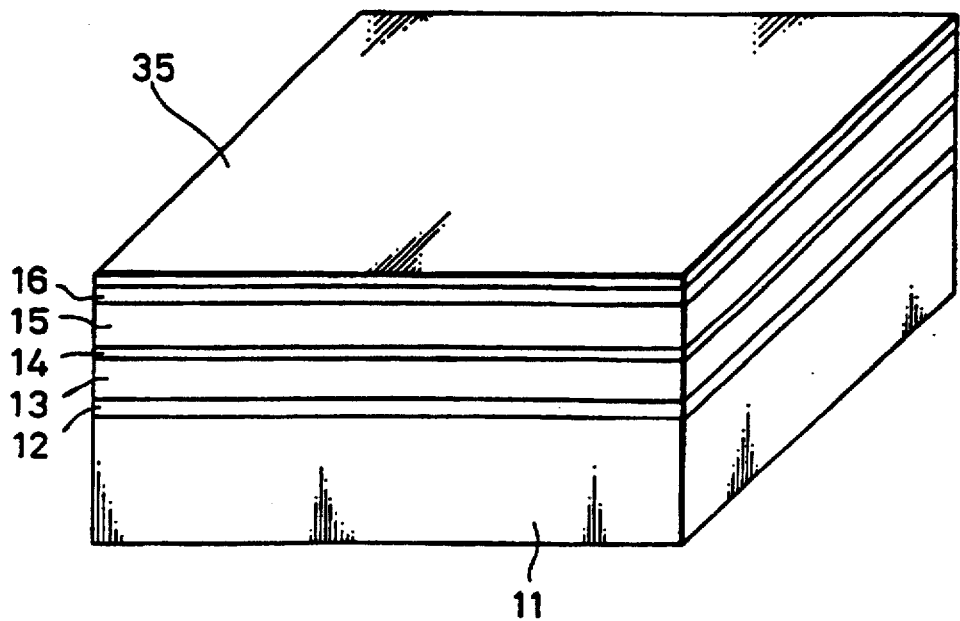

As shown in FIG. 8B, an $SiO_2$ insulating film 35 is formed on the whole surface of the laminated semiconductor layers thus epitaxially deposited.

Figure 8C:
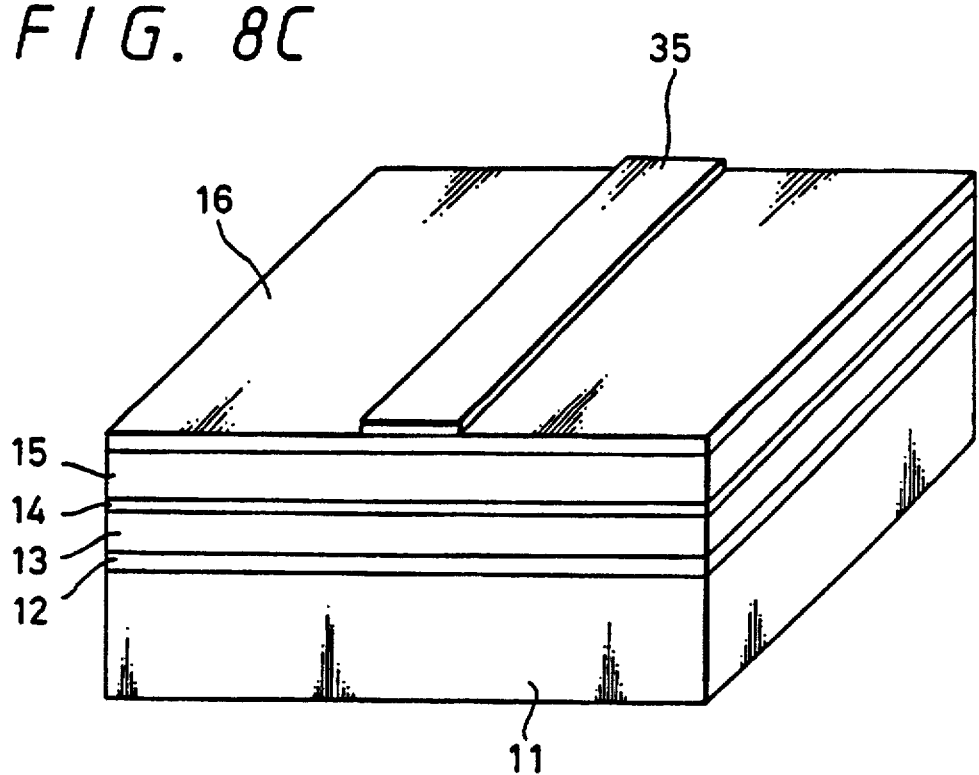

Thereafter, as shown in FIG. 8C, a part of the insulating film 35 is etched as a stripe-like pattern by a suitable method such as photolithography.

Figure 8D:
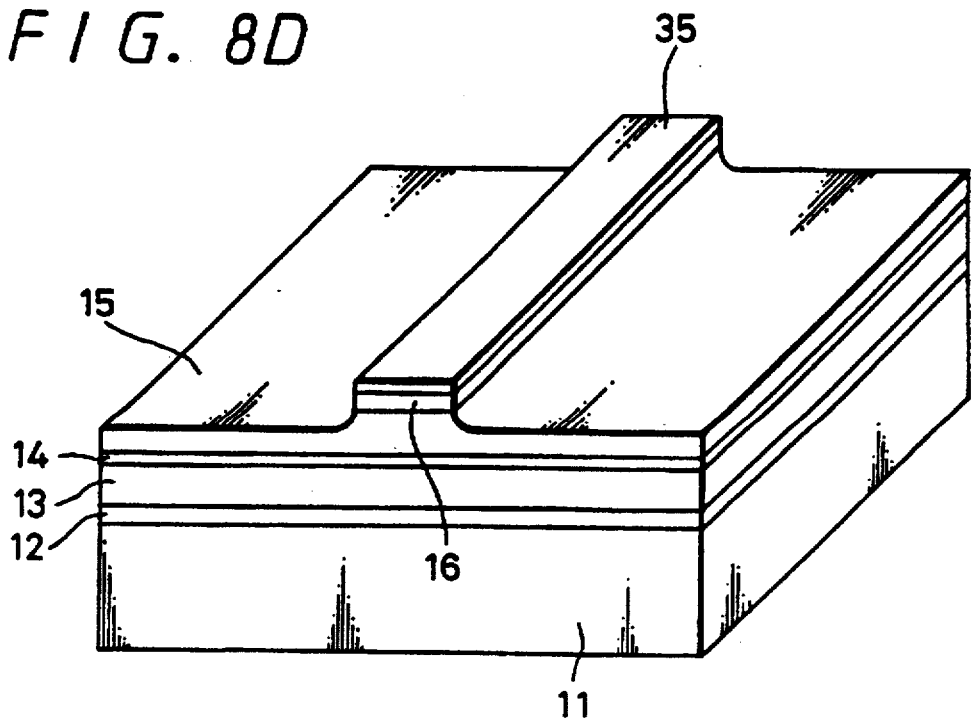

As shown in FIG. 8D, the stripe-shaped pattern of the insulating film 35 is used as a mask and the stripe-shaped pattern is transferred to a part of the capping layer 16 and the second cladding layer 15 by wet-etching.

Figure 8E:
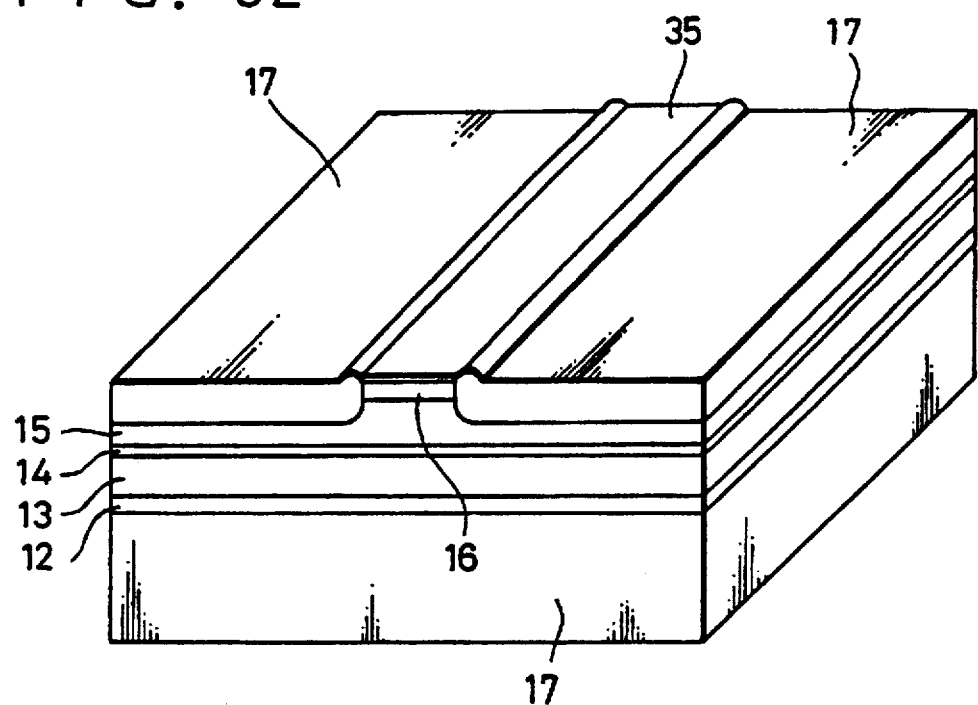

Then, as shown in FIG. 8E, a first conductivity-type, i.e., n-type highly-doped GaAs current confinement layer 17 is selectively deposited on the second cladding layer 15 thus etched-off.

Figure 8F:
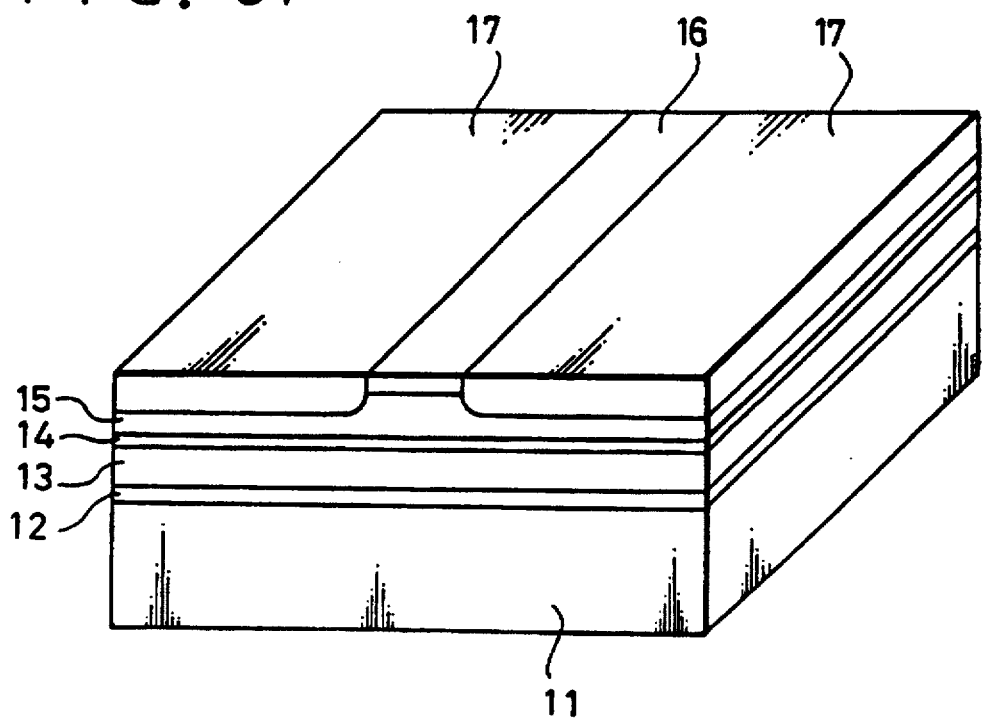

As shown in FIG. 8F, the insulating film 35 used as the mask is removed. Further, protruded portions on the surface of the current confinement layer 17 are flattened by planarization. Incidentally, this planarization for the protruded portions may be omitted.

Thereafter, a second conductivity-type, e.g., p-type heavily-doped impurity is diffused on the capping layer 16 and the second cladding layer 15 forming the stripe, if necessary.

This impurity diffusion may be carried out after the laminated layer was formed in FIG. 8A.

Figure 8G:
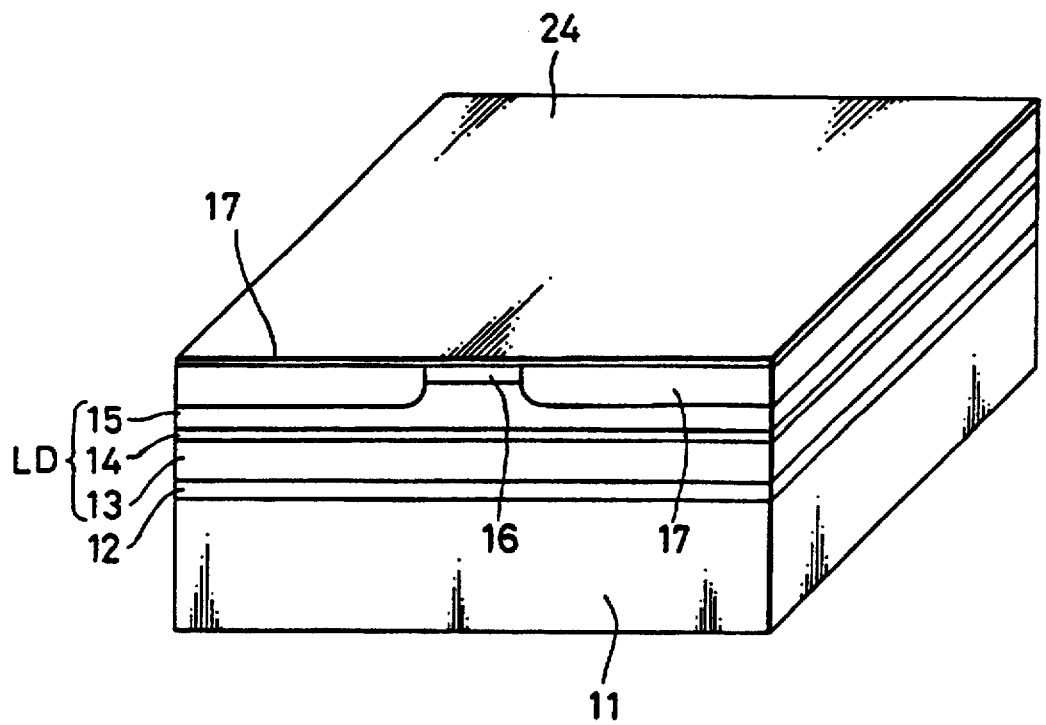

Then, as shown in FIG. 8G, an $SiO_2$ insulating film 24 which will serve as a selective-growth mask of the light-receiving portion 5 is formed on the whole surface.

Figure 8H:
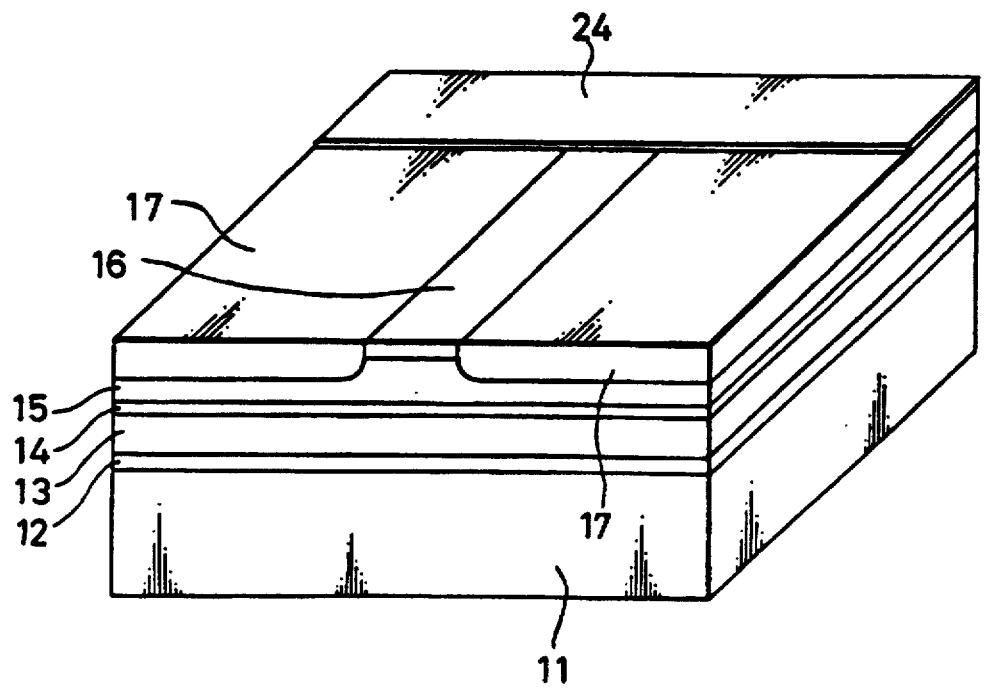

Further, as shown in FIG. 8H, the insulating film 24 is removed from the light-receiving portion 5 at its portion where the selective-growth is carried out. At that time, the portion masked by the insulating film 24 is the region in which the semiconductor layers constructing the light-receiving portion 5 are not selectively deposited in order to form the p-side electrode of the semiconductor laser LD of the light-emitting portion 4.

Figure 8I:
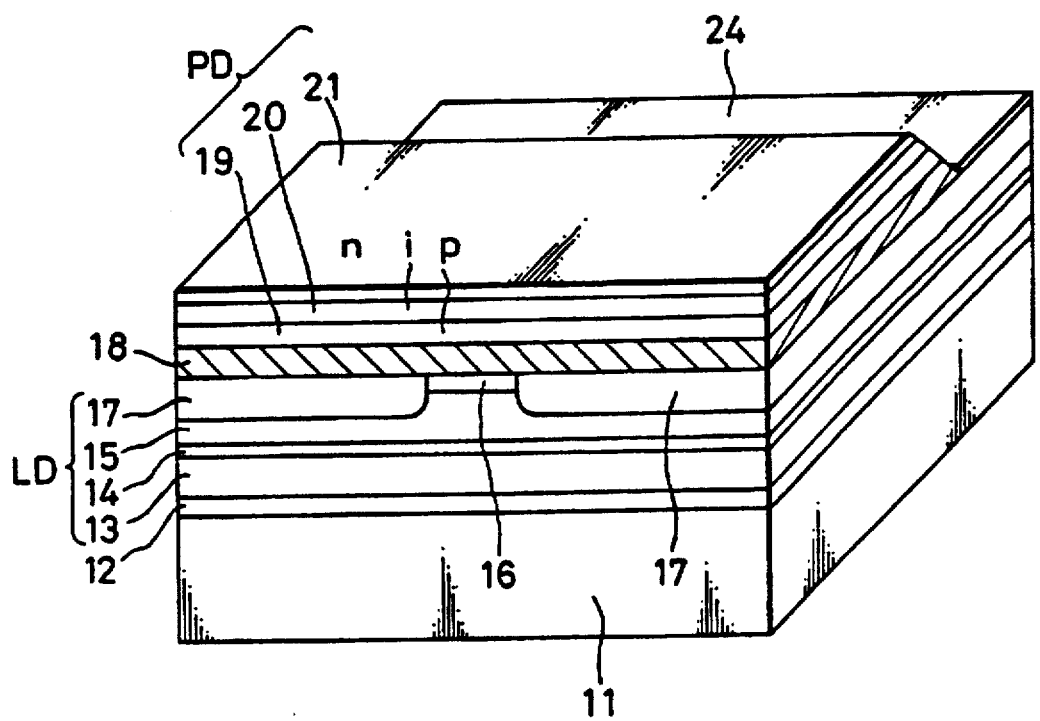

Then, as shown in FIG. 8I, a second conductivity-type, i.e., p-type heavily-doped GaAs light-absorption layer 18, a second conductivity-type, i.e., p-type GaAs first semiconductor layer 19, an i-type GaAs second semiconductor layer 20 and a first conductivity-type, i.e., n-type GaAs third semiconductor layer 21 are epitaxially deposited, thereby resulting in the light-receiving portion 5 formed of the photodiode PD being formed.

Figure 8J:
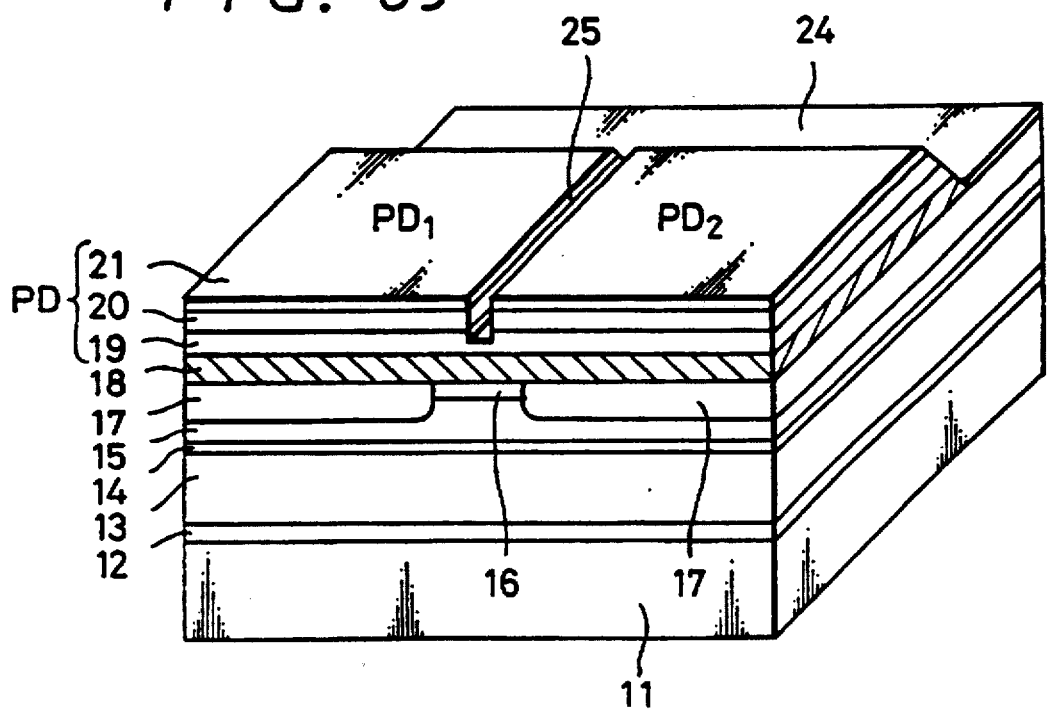

As shown in FIG. 8J, a groove 25 for dividing the photodiode by half is formed on a part of the third semiconductor layer 21, the second semiconductor layer 20 and the first semiconductor layer 19 by etching. The groove 25 is located at the center of the light-receiving portion 5 and directed in parallel to the stripe pattern, thereby the photodiode being divided into the photodiodes $PD_1$, $PD_2$.

Figure 8K:
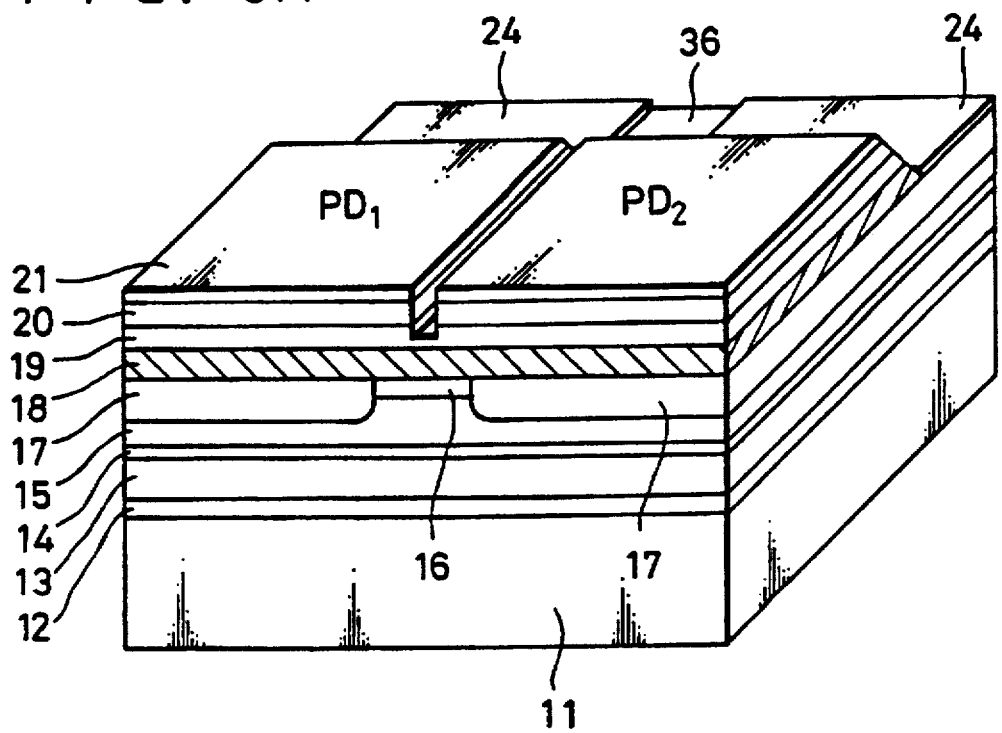

Then, as shown in FIG. 8K, the insulating film 24 serving as the selective growth mask is removed at its portion on the stripe pattern to form a contact-hole 36.

Figure 8L:
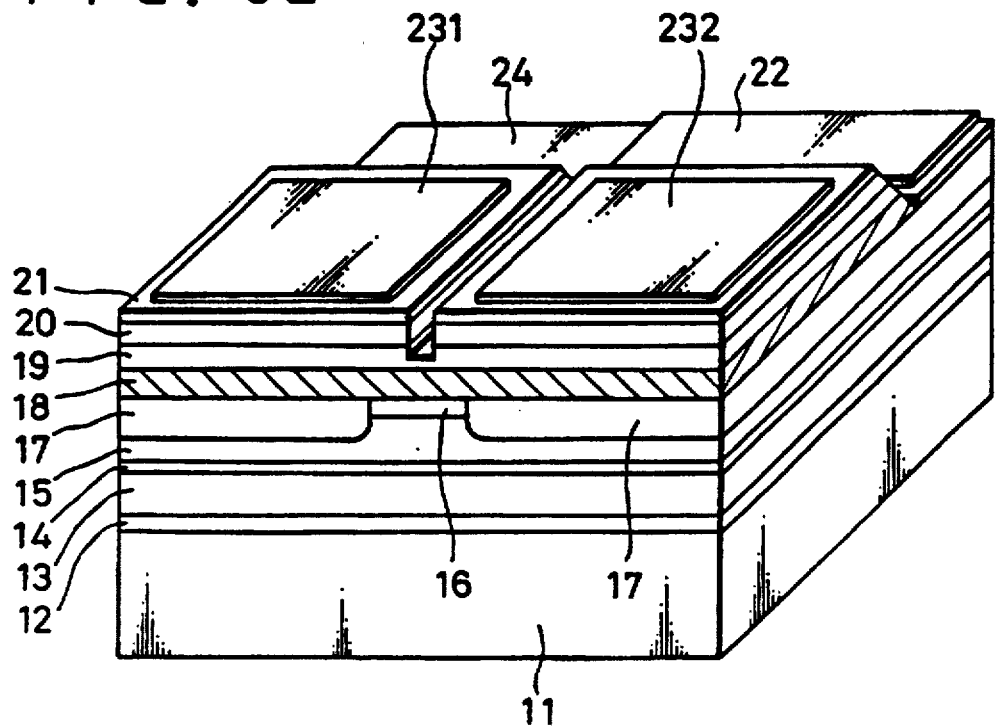

As shown in FIG. 8L, a p-side electrode 22 made of Ti/Pt/Au is formed on the contact-hole 36 and the insulating film 24 by vapor deposition. Also, n-side electrodes 231, 232 made of AuGe/Ni/Au are formed on the third semiconductor layer 21 of the photodiodes $PD_1$, $PD_2$.

Finally, the semiconductor substrate 11 is made thin by lapping and an n-side electrode 23 of the semiconductor laser LD made of AuGe/Ni/Au is formed on the rear surface of the semiconductor substrate 11 by vapor deposition. Then, the p-side electrode 22 and the n-side electrodes 23, 231, 232 are alloyed by heat treatment.

As described above, there can be formed the optical element 10 which comprising the optical device according to the present invention.

The optical device according to the present invention can provide a large margin for lens displacement and disk warp and disk skew compared with the conventional optical device. Therefore, the optical device according to the present invention can stably and accurately detect various signals such as the tracking servo signal and the RF signal which results from reading information recorded on the optical disk.

According to the present invention, since the light-emitting portion and the light-receiving portion are formed on the same semiconductor substrate, the whole of the optical pickup can be reduced in size.

Since the returned light from the irradiated portion travels along the same light path as that of the emitted light, the alignment of optical assemblies can be adjusted with ease. Moreover, a ratio of light returned to the light-receiving portion can be increased.

Further, since the optical device according to the present invention can enlarge the margin for the lens displacement and the lens warp and lens skew, the optical device according to the present invention can detect the tracking servo signal stably.

Since the end face of the semiconductor laser LD and the light-receiving surface of the photodiode PD can be formed by cleavages, the semiconductor laser need not be formed as a so-called surface-emission semiconductor laser.

Since the p-side electrode 22 which is common to the semiconductor laser LD and the photodiode PD is formed on the light-absorption layer 18 in the inventive example 1, the light-absorption layer 18 and the boundary layer on which the p-side electrode common to the semiconductor laser LD and the photodiode PD may be formed as different layers and laminated with each other.

The groove 25 for dividing the photodiode PD can easily be formed by a manufacturing process on the flat surface.

Further, instead of the groove 25, the photodiode PD can be divided by a diffusion layer and an ion-implanted layer.

While the light-receiving portion is formed just above the light-emitting portion and the light-absorption layer is disposed between the light-receiving portion and the light-emitting portion in the inventive example 1, the present invention is not limited thereto and a layer for carrying out light-absorption and current-blocking may be disposed between the light-emitting portion and the light-receiving portion, which example will be described below with reference to FIG. 9.

Figure 9:
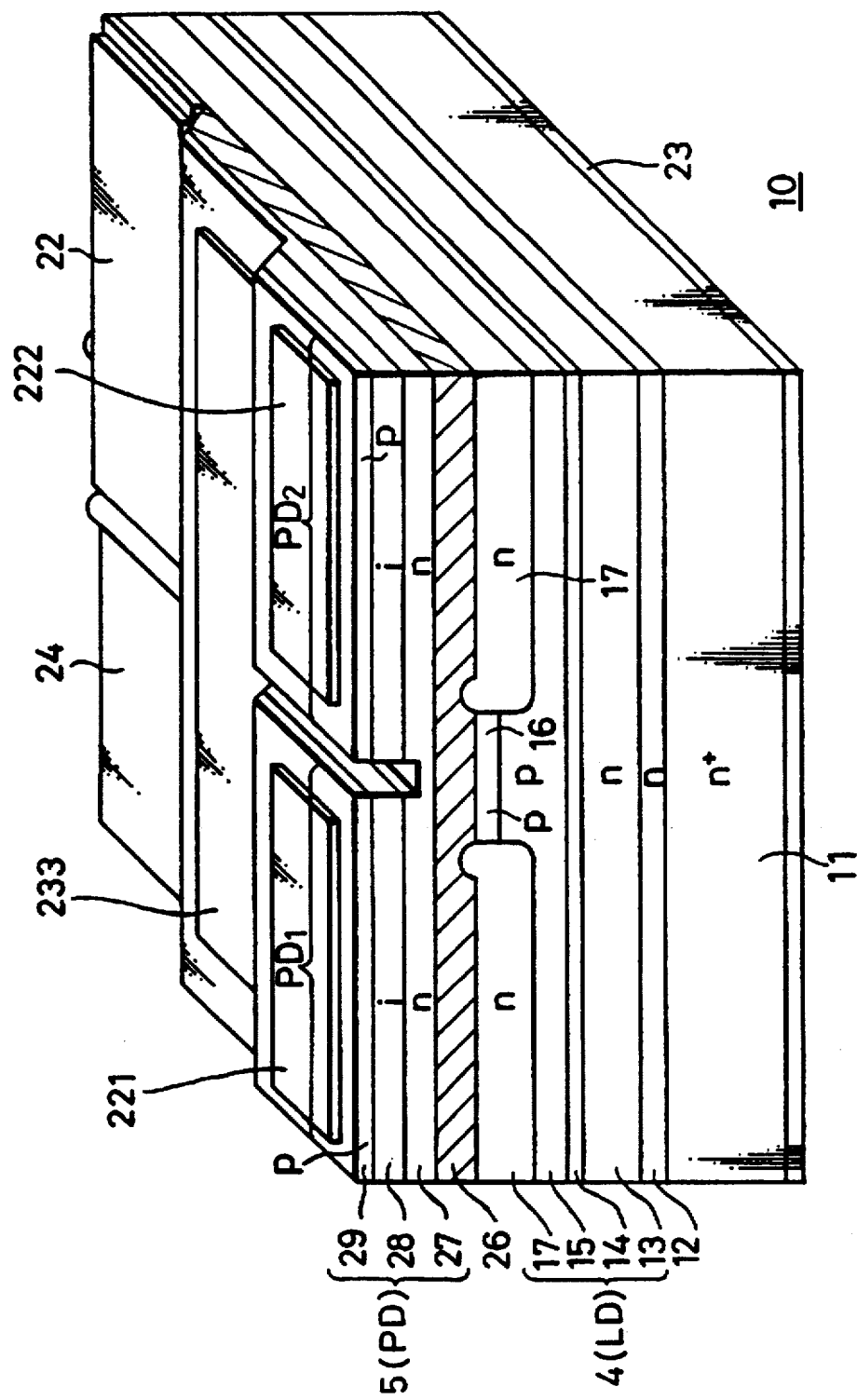
FIG. 9 is a perspective view illustrative of an optical device according to a second embodiment of the present invention.

FIG. 9 is a perspective view illustrating other example (hereinafter referred to as "inventive example 2") of the optical device according to the present invention.

In the inventive example 2, instead of the light-absorption layer 18 in the optical element 10 according to the inventive example 1, there is provided a light-absorption and current-blocking layer 26 formed of a laminated layer of n-type and p-type GaAs layers. The light-receiving portion 5 of two PIN-type photodiodes PD ($PD_1$, $PD_2$) is formed on the light-absorption and current-blocking layer 26.

Specifically, a PIN-type photodiode is formed on the semiconductor laser LD with the structure similar to that of the inventive example 1 through the light-absorption and current-blocking layer 26.

In the inventive example 2 shown in FIG. 9, protruded portions of the current confinement layer 17 on the upper surface of the semiconductor laser LD are left as they are. Accordingly, protrusions are protruded on the surface of the insulating layer 24 serving as the selective growth mask.

Further, conductivity types of the semiconductor layers composing the photodiode PD of the light-receiving portion 5 are opposite to those of the inventive example 1. The first conductivity-type, i.e., n-type first semiconductor layer 27, i-type second semiconductor layer 28 and a second conductivity-type, i.e., p-type third semiconductor layer 29 constitute the photodiode PD.

In the case of FIG. 9, respective electrodes of the light-emitting portion 4 are located in the same manner as that of FIG. 3. In the electrode of the light-receiving portion 5, by two steps of selective growth or etching after epitaxial deposition, the first semiconductor layer 27 has a difference in level where an n-side electrode 233 is formed and p-side electrodes 221 and 222 are disposed on the third semiconductor layer 29. In FIG. 9, reference numerals 22 and 23 denote p-side electrode and n-side electrode of the semiconductor laser LD, 233 denotes an n-type electrode common to the photodiodes $PD_1$, $PD_2$ and 221 and 222 denote p-type electrodes of the photodiodes $PD_1$, $PD_2$, respectively.

The light-absorption and current-blocking layer 26 is formed of GaAs layer of pn structure and pnp structure or laminated layers comprising GaAs layers of pn structure and pnp structure. In addition, the light-absorption and current-blocking layer 26 may be formed of a material having a large bandgap, a superlattice layer or n-type or p-type heavily-doped layer serving as a carrier-killer layer or an SI (Semi-Insulator).

A rest of arrangement is similar to that of the inventive example 1. In FIG. 9, like elements and parts corresponding to those of the inventive example 1 are marked with the same references and therefore need not be described in detail.

The optical device according to the inventive example 2 can obtain the tracking servo signal stably and achieve effects similar to those of the inventive example 1.

Further, according to the inventive example 2, since the light-emitting portion 4 and the light-receiving portion 5 are electrically separated from each other by the light-absorption and current-blocking layer 26, the p-side electrodes and the n-side electrodes of the light-emitting portion 4 and the light-receiving portion 5 can be formed independently.

While the light-receiving surface of the photodiode PD is formed by the end face of the laminated film, e.g., cleavage surface or the like and flush with the end face of the semiconductor laser LD in the inventive example 1, the light-receiving surface of the photodiode PD may be formed as a surface oblique to the end face of the semiconductor laser LD. An example in which a specific crystal plane is used as a light-receiving surface of a photodiode will be described with reference to FIG. 10.

Figure 10:
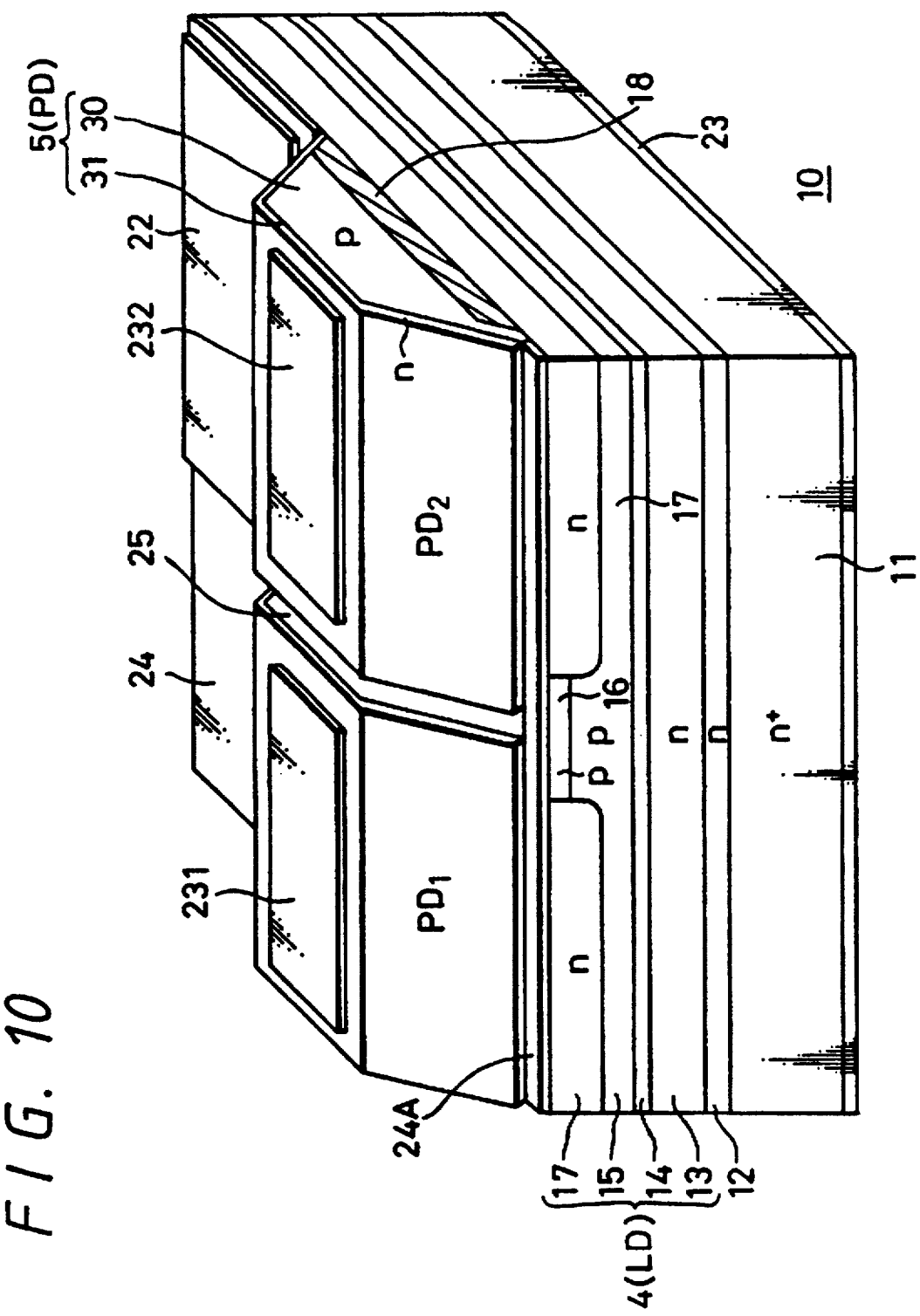
FIG. 10 is a perspective view illustrative of an optical device according to a third embodiment of the present invention.

FIG. 10 is a perspective view illustrating other example (hereinafter referred to as "inventive example 3") of the optical device according to the present invention. In the inventive example 3, the light-receiving surfaces of the two photodiodes composing the light-receiving portion 5 are formed as specific crystal planes of the semiconductor layer.

As shown in FIG. 10, on the light-emitting portion 4 formed of the semiconductor laser LD with the arrangement similar to that of the inventive example 1 shown in FIG. 3 are formed a second conductivity-type, i.e., p-type heavily-doped GaAs light-absorption layer 18, a second conductivity-type, i.e., p-type GaAs first semiconductor layer 30 and a first conductivity-type, i.e., n-type GaAs second semiconductor layer 31 by the selective growth using insulating layers 24 and 24A as masks. A (111) or (110) crystal plane is formed on the second semiconductor layer 31 at the resonator end face of the semiconductor laser LD on the light-emitting portion 4 such that the (111) or (110) crystal plane become oblique to the resonator end face. This crystal plane is used as the light-receiving surface of the photodiodes PD ($PD_1$, $PD_2$).

Figure 11:
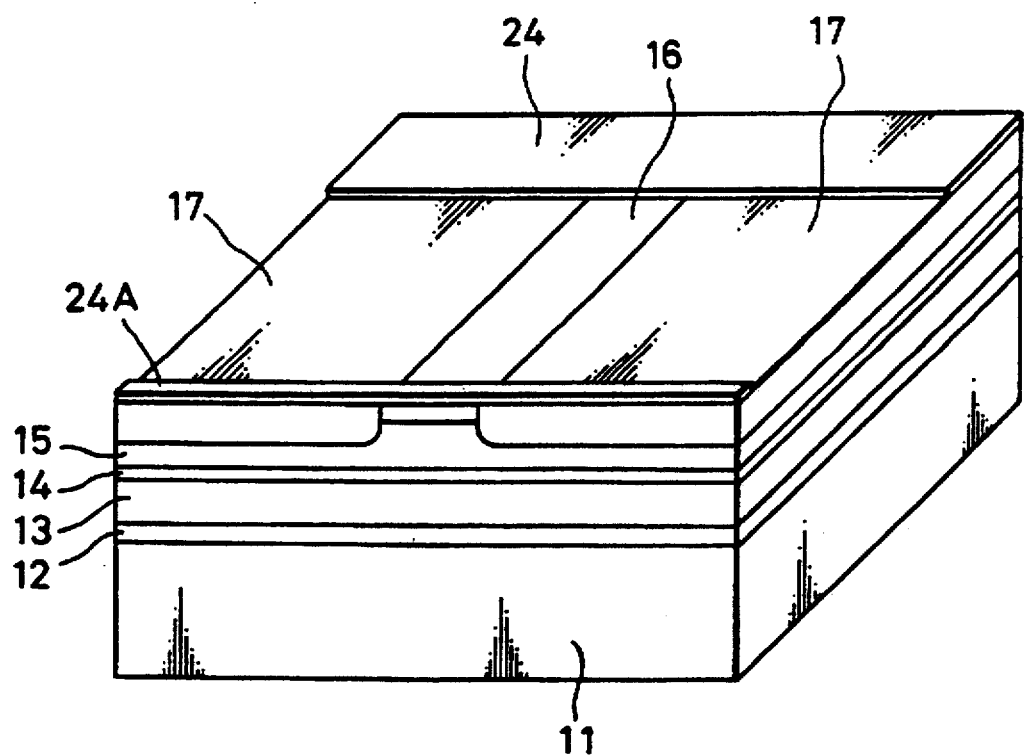
FIG. 11 is a process diagram of one process for manufacturing the optical device shown in FIG. 11.

The manufacturing process of this optical device adopts processes similar to those of the inventive example 1 shown in FIGS. 8A through 8L. In the process in which the selective growth mask is formed by the insulating film 24 as shown in FIG. 8H in the inventive example 1, a long mask is formed by the insulating film 24A on the end face side of the semiconductor laser LD as shown in FIG. 11. By this long insulating film 24A, the first semiconductor layer 30 and the second semiconductor layer 31 are selectively deposited on the resonator end face such that the (111) or (110) crystal plane is disposed on the light-receiving surface.

A rest of arrangement is the same as that of the inventive example 1. Accordingly, in the inventive example 3, like elements and parts corresponding to those of the inventive example 1 are marked with the same references and therefore need not be described in detail.

Figure 12:
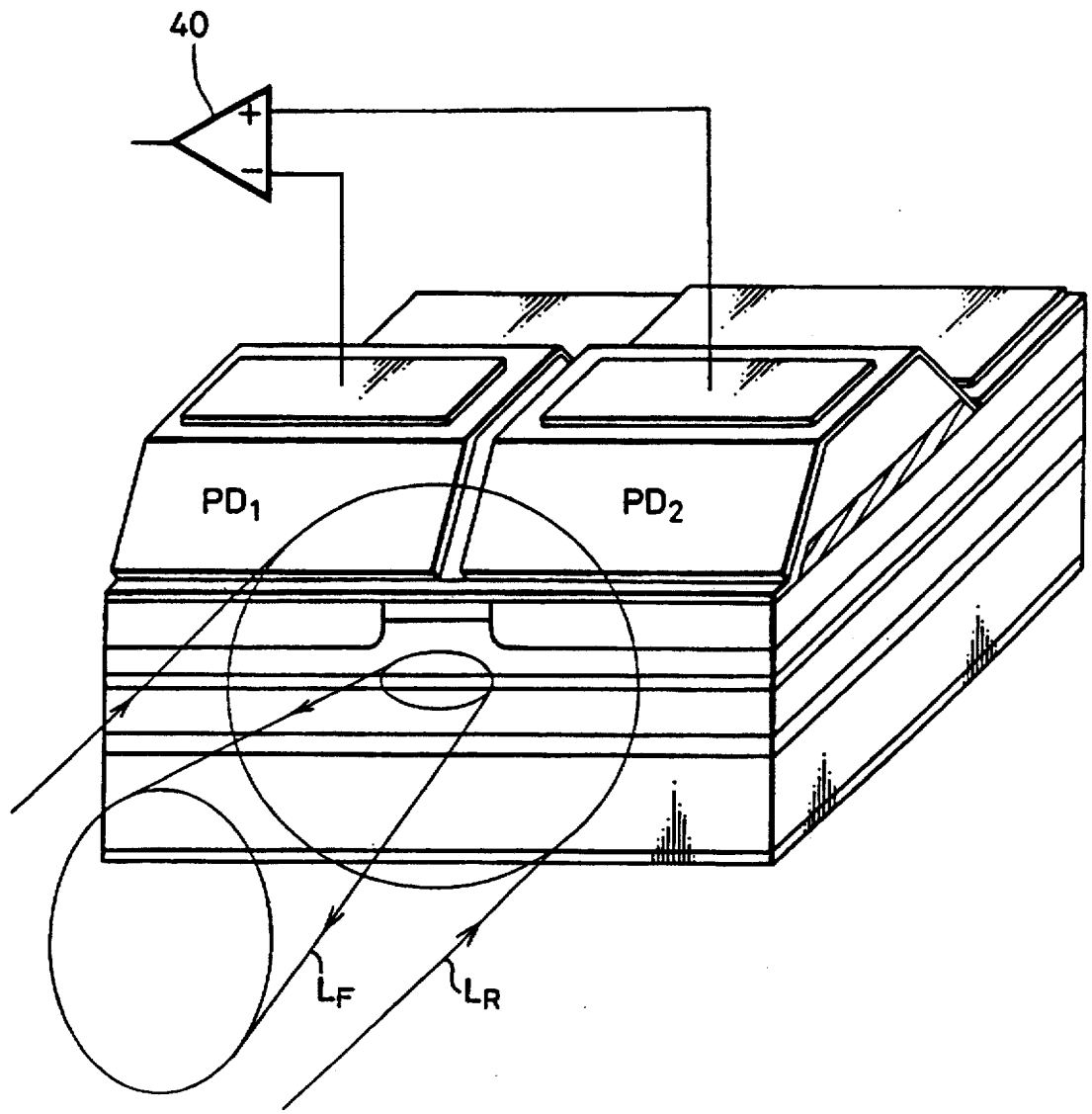
FIG. 12 is a perspective view illustrative of a manner in which the optical device shown in FIG. 10 detects a signal.

In the inventive example 3, a signal can be detected in a manner similar to that of the inventive example 1 shown in FIG. 4. Specifically, as shown in FIG. 12, laser beam is emitted from the semiconductor laser LD of the light-emitting portion 4. Emitted light $L_F$ generates the returned light $L_R$ from the irradiated portion 2 as mentioned before. Then, the returned light $L_R$ is received by the photodiodes $PD_1$ and $PD_2$ composing the light-receiving portion 5.

Then, a differential amplifier 40 detects a tracking servo signal based on a difference signal of ($PD_2-PD_1$) serving as a detecting signal according to the push-pull method by use of signals received at these photodiodes $PD_1$ and $PD_2$.

The optical device according to the inventive example 3 can obtain a tracking servo signal stably and achieve effects similar to those of the optical device according to the inventive example 1.

Further, in the inventive example 3, since the light-receiving surface is formed with the inclination relative to the resonator end face, the returned light $L_R$ is introduced obliquely and a light-receiving area can be increased.

In the case of the inventive example 3, the pn junction composing the photodiode PD may be formed by a growth of continuous laminated layer as shown in FIG. 10 or may be formed by diffusion of impurity after the crystal was grown on the first semiconductor layer. When the photodiodes $PD_1$ and $PD_2$ are formed by diffusion, the light-receiving surface is not limited to the specific crystal plane and can be formed by the etching surface.

Further, the photodiode PD may be formed as a PIN-type having a pin coupling.

Figure 13:
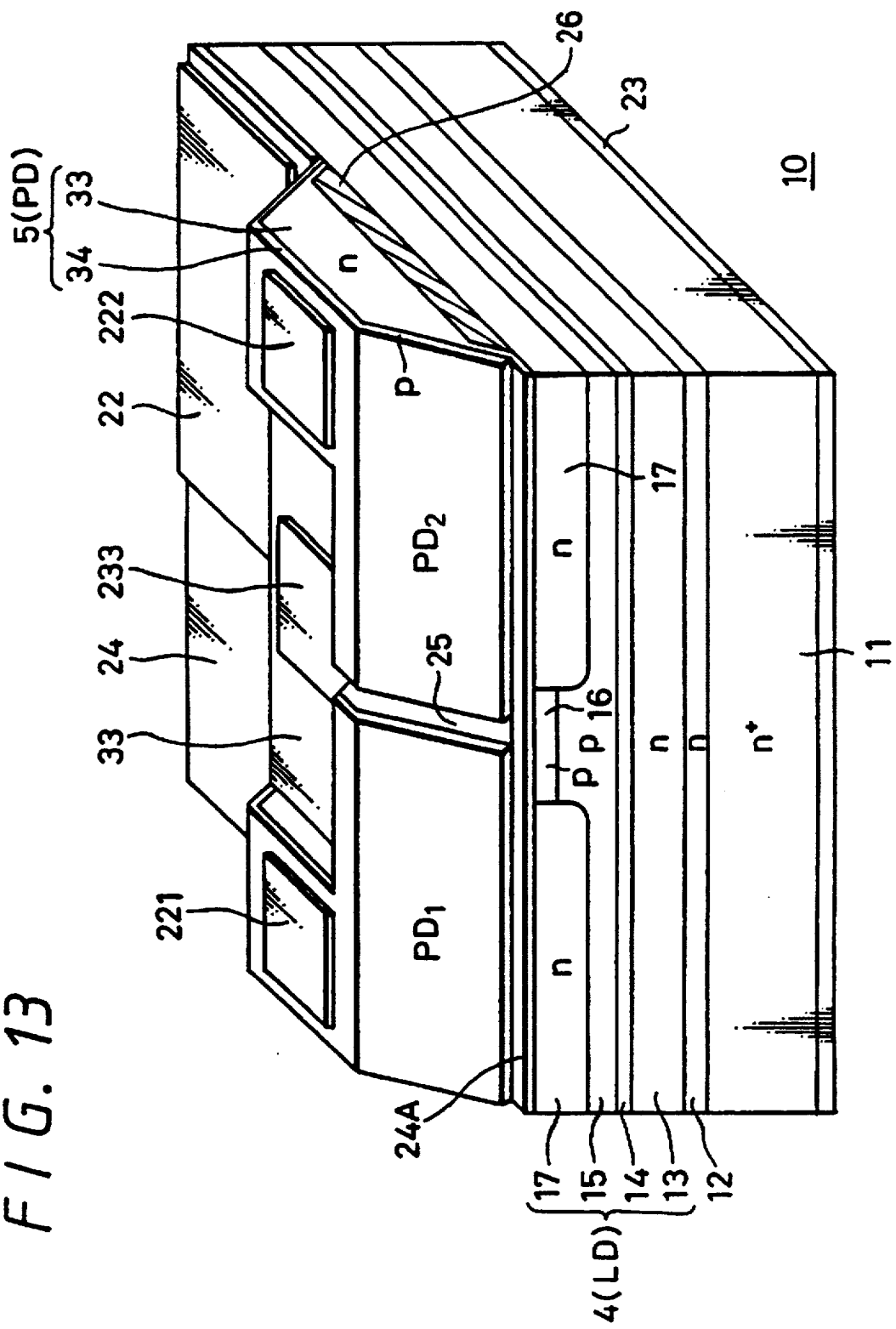
FIG. 13 is a perspective view illustrative of an optical device according to a fourth embodiment of the present invention.

FIG. 13 is a perspective view illustrating a further example (hereinafter referred to as "inventive example 4") of the optical device according to the present invention. In the inventive example 4, the light-absorption and current-blocking layer 26 according to the inventive example 2 shown in FIG. 9 is provided in the structure of the inventive example 3 shown in FIG. 10.

As shown in FIG. 13, on the semiconductor laser LD with the same structure as that of the inventive example 3 are formed a GaAs light-absorption and current-blocking layer 26 with the pn structure, a first conductivity-type, i.e., n-type GaAs first semiconductor layer 33 and a second conductivity-type, i.e., p-type GaAs second semiconductor layer 34 by the selective growth using the insulating films 24 and 24A as masks. A (111) or (110) crystal plane is obliquely formed on the resonator end face of the semiconductor laser LD of the light-emitting portion 4.

In this case, the conductivity types of the respective semiconductor layers composing the photodiodes $PD_1$, $PD_2$ become opposite to those of the inventive example 3.

In this inventive example 4, the n-type first semiconductor layer 33 is exposed by selectively etching the central portion including the two photodiodes $PD_1$ and $PD_2$. The n-side electrode 233 common to the two photodiodes $PD_1$, $PD_2$ is formed on the first semiconductor layer 33 and p-side electrodes 221, 222 of the photodiodes $PD_1$, $PD_2$ are formed on the p-type second semiconductor layer 34. Specifically, similarly to the inventive example 2, the p-side electrodes and the n-side electrodes of the light-emitting portion 4 and the light-receiving portion 5 can be formed independently.

A rest of the arrangement is the same as that of the inventive example 1 or 3. Accordingly, in the inventive example 4, like elements and parts corresponding to those of the inventive examples 1 and 3 are marked with the same references and therefore need not be described in detail.

The optical device according to the inventive example 4 can obtain the tracking servo signal stably and achieve effects similar to those of the optical device according to the inventive example 1.

Figure 14:
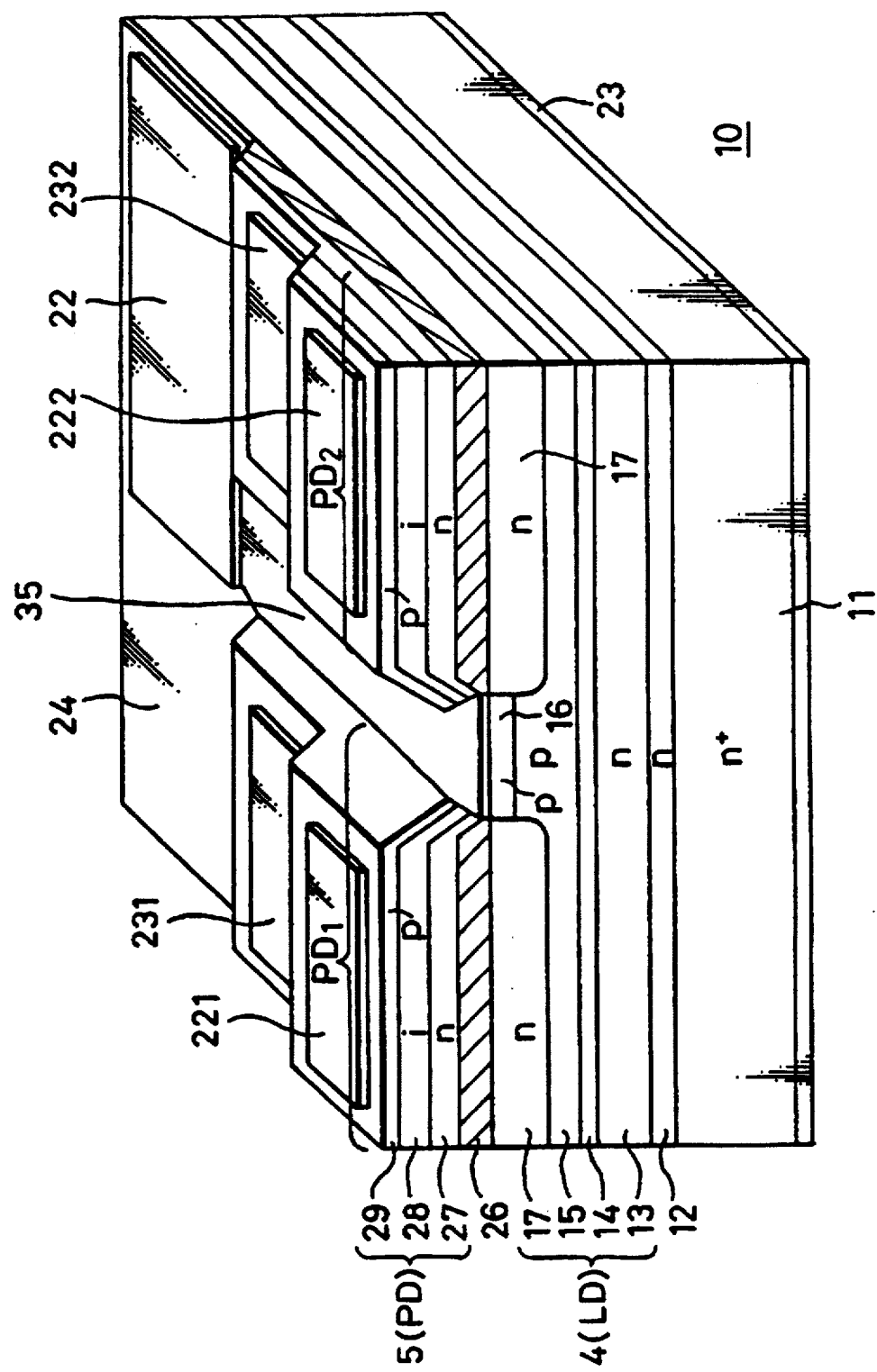
FIG. 14 is a perspective view illustrative of an optical device according to a fifth embodiment of the present invention.

FIG. 14 is a perspective view illustrating a further example (hereinafter referred to as "inventive example 5") of the optical device according to the present invention. In the inventive example 5, a current confinement layer and the photodiode of the semiconductor laser LD are continuously formed by selective growth with the same mask.

In the inventive example 5, after a semiconductor laser LD with the same structure as that of the inventive example 1 was formed, a GaAS light-absorption and current-blocking layer 26 with a pn structure, a first conductivity-type, i.e., n-type GaAs first semiconductor layer 27, i-type GaAs second semiconductor layer 28 and a second conductivity-type, e.g., p-type GaAs third semiconductor layer 29 are sequentially and selectively deposited on both sides by using the mask 35 that was used to form the current confinement layer 17, thereby forming two PIN-type photodiodes $PD_1$, $PD_2$.

Further, n-side electrodes 231 and 232 of the photodiodes $PD_1$ and $PD_2$ are formed on the step which was formed on the n-type first semiconductor layer 27 by etching or selective growth of two stages. On the third semiconductor layer 29 are formed p-side electrodes 221 and 222 of the photodiodes $PD_1$ and $PD_2$.

The p-side electrode 22 of the semiconductor laser LD was etched off up to the light-absorption and current-blocking layer 26. Then, after the insulating film 24 was formed on the etched-off portion, the p-side electrode 22 is formed on the insulating film 24 through a contact hole (not shown) defined on the insulating film 24.

A rest of arrangement is similar to those of the inventive examples 1 to 4. Accordingly, in the inventive example 5, like elements and parts corresponding to those of the inventive examples 1 to 4 are marked with the same references and therefore need not be described in detail.

The optical device according to the inventive example 5 can obtain a tracking servo signal stably and achieve effects similar to those of the optical device according to the inventive example 1.

According to the inventive example 5, electrodes of the semiconductor laser LD and the photodiode PD are formed independently.

Further, according to the inventive example 5, the number of selective growth can be decreased and the separation of the photodiodes can be made in a self-alignment by the mask.

While the photodiode PD is formed just above the semiconductor laser LD in the inventive example 1, the photodiode PD can be formed just beneath the semiconductor laser LD.

Figure 15:
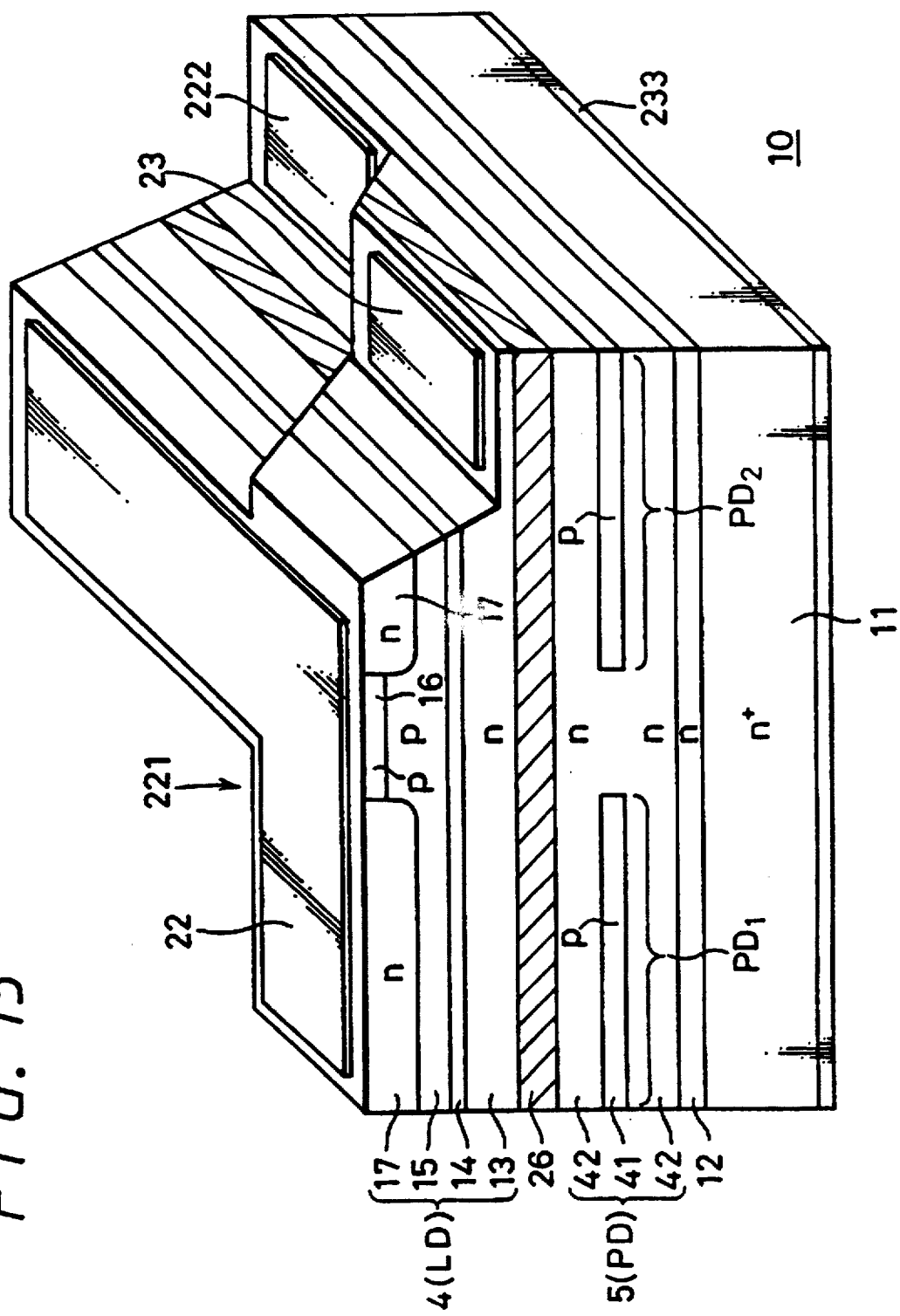
FIG. 15 is a perspective view illustrative of an optical device according to a sixth embodiment of the present invention.

FIG. 15 is a perspective view illustrating a further example (hereinafter referred to as "inventive example 6") off the optical device according to the present invention. In this inventive example 6, the light-receiving portion 5 is formed just beneath the light-emitting portion 4, and the photodiode PD of the light-receiving portion 4 is of the structure such that a p-type semiconductor layer 41 is sandwiched by n-type semiconductor layers 42.

In this optical device, a first conductivity-type, i.e., n-type GaAs buffer layer 12 is formed on a first conductivity-type, e.g., n-type heavily-doped GaAs semiconductor substrate 11 and the photodiode PD is formed on the buffer layer 12 such that the p-type semiconductor layer 41 is sandwiched by the n-type semiconductor layers 42. The central portion of the p-type semiconductor layer 41 is replaced with the n-type semiconductor layer 42 in a stripe fashion, thereby forming two photodiodes $PD_1$, $PD_2$ right and left.

Then, a first conductivity-type, i.e., n-type cladding layer 13, an active layer 13, a second conductivity-type, i.e., p-type cladding layer 15, a second conductivity-type, i.e., p-type capping layer 16 and a current confinement layer 17 are formed on the photodiode PD through the light-absorption and current-blocking layer 26, thereby resulting in the semiconductor laser LD with a structure similar to that of the inventive example 1.

A p-side electrode 22 of the semiconductor laser LD is formed on the semiconductor laser LD.

An n-side electrode 23 of the semiconductor laser LD is formed on a step which was formed by etching a part of the semiconductor laser LD structure to the n-type cladding layer 13.

The p-side electrodes 221, 222 of the photodiodes $PD_1$, $PD_2$ are formed by etching a part of the semiconductor laser LD structure up to the p-type semiconductor layer 41. In FIG. 15, the p-side electrode 221 of the photodiode $PD_1$ is formed on the photodiode $PD_1$ at its side hidden.

An n-side electrode 233 common to the photodiodes $PD_1$, $PD_2$ is formed on the rear surface of the semiconductor substrate 11.

A rest of arrangement in the inventive example 6 is the same as those of the inventive examples 1 to 4. Accordingly, in the inventive example 6, like elements and parts corresponding to those of these inventive examples 1 to 4 are marked with the same references and therefore need not be described in detail.

Since the p-type semiconductor layer 41 is sandwiched by the n-type semiconductor layers 42, the pn junction can be increased and hence, the light-receiving area can be increased.

The optical device according to the inventive example 6 can obtain a tracking servo signal stably and achieve effects similar to those of the optical device according to the inventive example 1.

Further, in the inventive example 6, the photodiode PD need not be separated by forming the groove 25 unlike other inventive examples.

In this case, the photodiode PD may be formed and separated in such a fashion that the p-type semiconductor layer 41 is formed within the n-type semiconductor layer 42 except the central portion by selective diffusion. Also, after the p-type semiconductor layer 41 was epitaxially deposited on the n-type semiconductor layer 42, the photodiode PD may be separated by removing the central portion of the p-type semiconductor layer 41 by etching.

According to the arrangement of the inventive example 6, the PIN photodiode can be made by inserting the i-type semiconductor layer between the p-type semiconductor layer 41 and the n-type semiconductor layer 42.

While the light-receiving portion 5 is formed just above or just under the light-emitting portion 4 as described above, the present invention is not limited thereto and two light-receiving portions 5 composed of the photodiodes PD may be formed just above and just under the light-emitting portion 4.

In this case, since a plurality of photodiodes are formed in the upper and lower direction, the photodiode PD need not be separated like the inventive example 6.

In this case, since the two photodiodes $PD_1$, $PD_2$ are formed on the upper and lower portions of the light-emitting portion 4, the upper and lower photodiodes $PD_1$ and $PD_2$ can detect a tracking servo signal according to the push-pull method. That is, the photodiodes PD located just above and under the light-emitting portion 4 are respectively used as the photodiodes $PD_1$ and $PD_2$ and it is possible to detect a tracking servo signal by using the signal ($PD_2$–$PD_1$) as the detecting signal based on the push-pull method.

A track interval of an optical recording medium which serves as the irradiated portion is narrowed as the recording density increases. At that time, in order to prevent a crosstalk from taking place between adjacent tracks, it is frequently observed that the tracking servo should be carried out on the upper and lower portions of the active layer 15 of the semiconductor laser LD. Also in this case, if the optical device according to the present invention is applied, then it is possible to accurately detect a tracking servo signal based on the push-pull method.

If the optical element 10 is arranged as in the above-mentioned inventive examples, then the spacing between the light-emitting portion 4 and the light-receiving portion 5 can be made less than several micrometers and hence the light-receiving portion can be provided within the diffraction limit of the returned light $L_R$.

A manner in which the present invention is applied to the optical device in actual practice will be described below.

The optical device according to the present invention can be mounted in a so-called junction-up fashion, i.e., in the junction of the form of the heat-sink/compound semiconductor substrate/semiconductor laser from the bottom, in that order.

Further, from a standpoint of heat-radiation property, the optical device according to the present invention can be mounted on a silicon substrate or the like serving as the heat-sink in a so-called junction-down fashion. i.e.. in the junction of the form of the heat-sink/semiconductor laser/compound semiconductor substrate from the bottom. in that order. Also, there can be made a so-called LOP in which a rear-monitor PD is fabricated on a silicon substrate which serves as a sub-mount.

An example of connection in this optical device to which the LOP is applied will be described with reference to FIG. 16.

Figure 16:
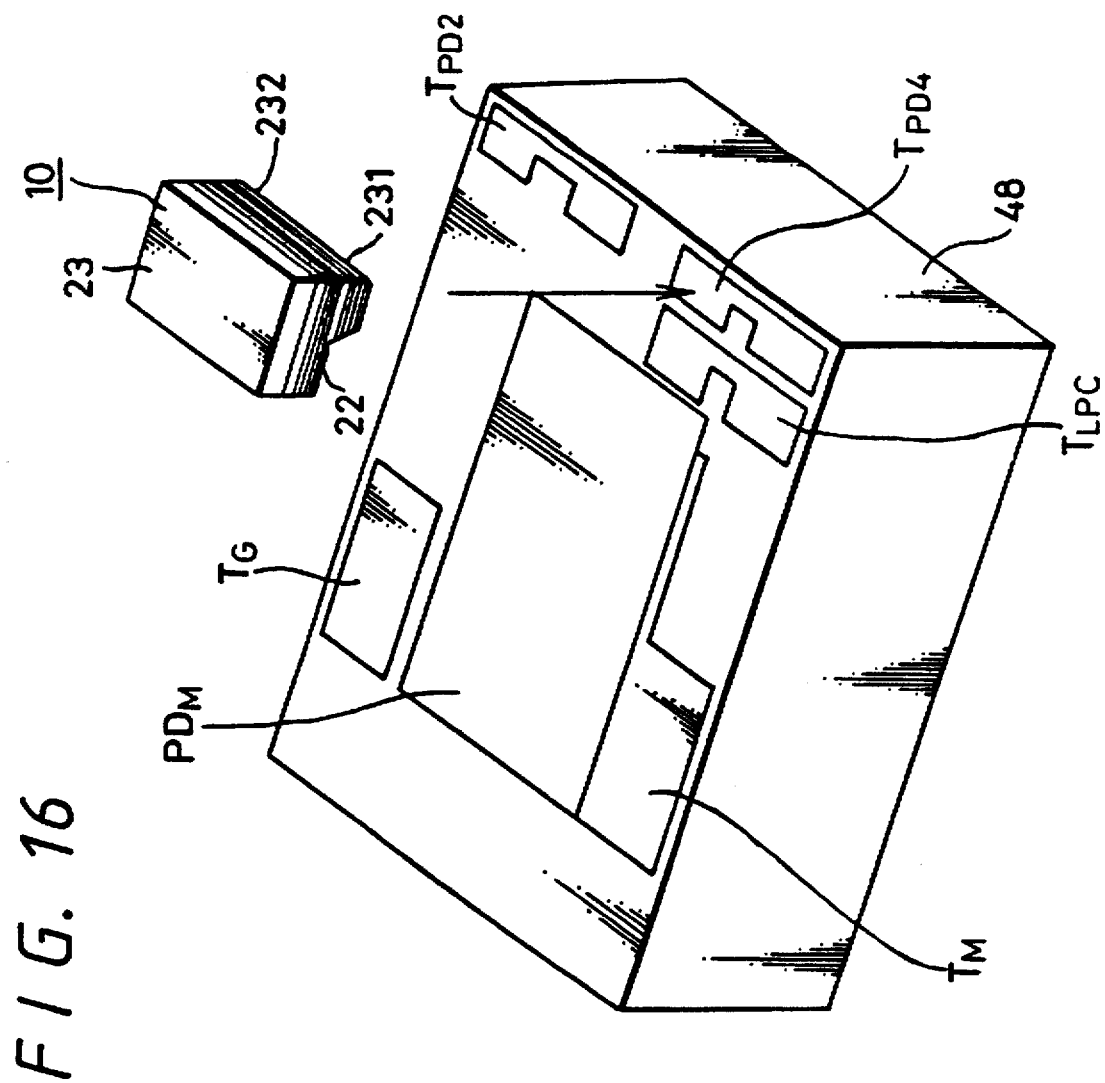
FIG. 16 is a perspective view illustrating an example of interconnection in the optical device according to the present invention.

Respective terminals in FIG. 16 are disposed when the semiconductor laser LD and the photodiode PD share one electrode, e.g., p-side electrode as in the preceding inventive examples 1 and 3.

As shown in FIG. 16, on a silicon substrate 48 in which a monitor photodiode $PD_M$ for adjusting a laser output are disposed a terminal $T_{PD1}$ for photodiode $PD_1$, a terminal $T_{PD2}$ for photodiode $PD_2$, a terminal $T_{PLC}$ serving as a common electrode for the semiconductor laser LD/photodiode PD, a terminal $T_M$ for monitor photodiode $PD_M$ and a ground terminal $T_G$.

The electrodes 231, 232, 22 of the optical element 10 are respectively bonded to and electrically connected to the terminal $T_{PD1}$ for the photodiode $PD_1$, the terminal $T_{PD2}$ for the photodiode $PD_2$ and the terminal $T_{LPC}$ serving as the common electrode for the semiconductor laser LD/photodiode PD. The n-side electrode 23 of the semiconductor laser LD formed on the rear surface of the semiconductor substrate 11 of the optical element 10 is connected to the ground terminal $T_G$ with a metal thin wire by wire-bonding, although not shown.

In the case of the arrangement of other electrodes, respective terminals are disposed in accordance with the layout of the electrodes and can be connected similarly.

Figure 17:
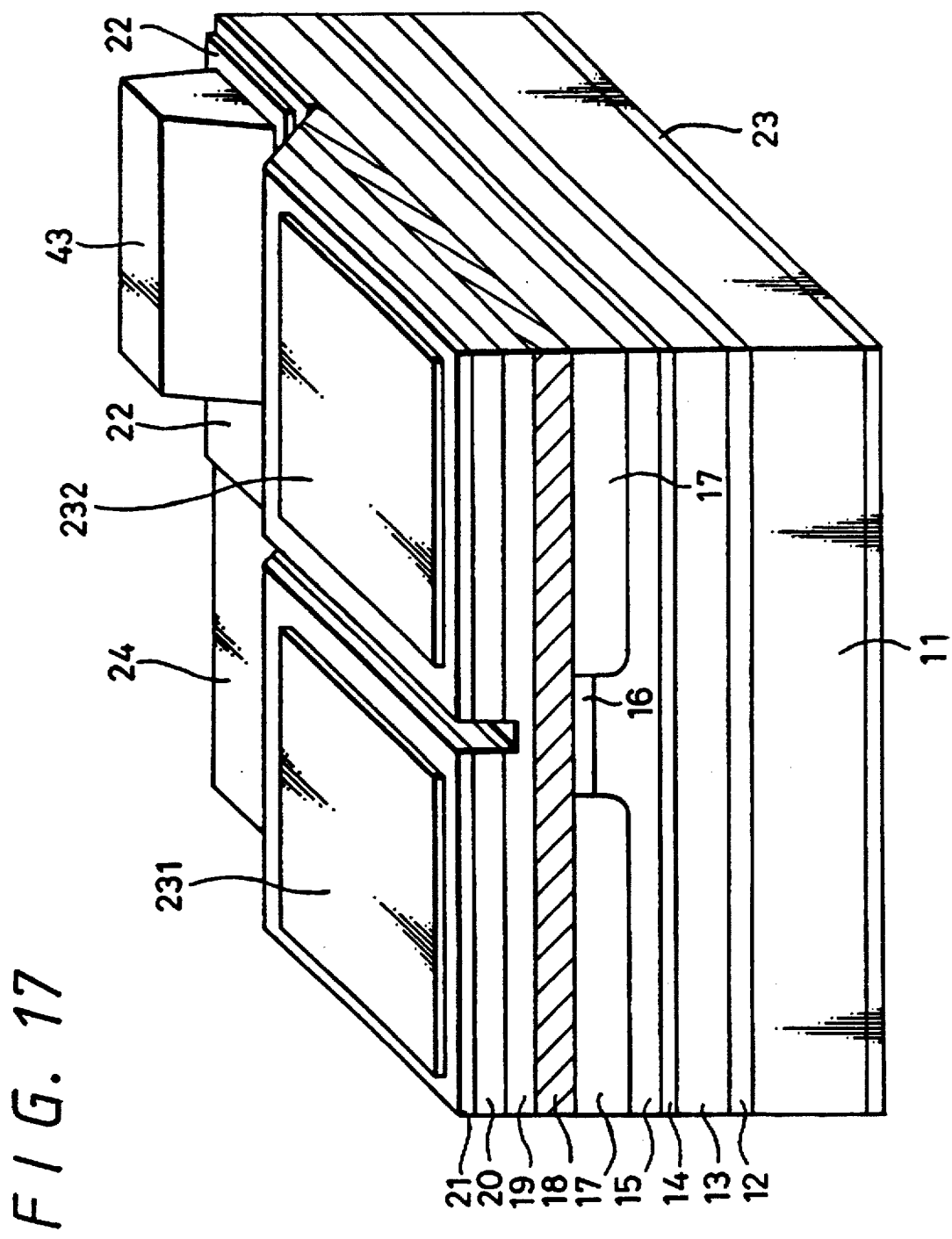
FIG. 17 is a perspective view illustrating a manner in which heights of electrodes are increased by electrolytic plating.

If there are steps between the p-side electrode 22 which is common to the semiconductor laser LD and the photodiode PD and the n-side electrodes 231 and 232 of the photodiodes $PD_1$, $PD_2$ like the inventive example 1 shown in FIG. 3, then they may be connected by interconnection. However, as shown in FIG. 17, the n-side electrodes 231 and 232 can be raised to the same height of the lower electrode, i.e., the common p-side electrode 22 in FIG. 17 by an Au electrolyte plating 43.

Figure 18:
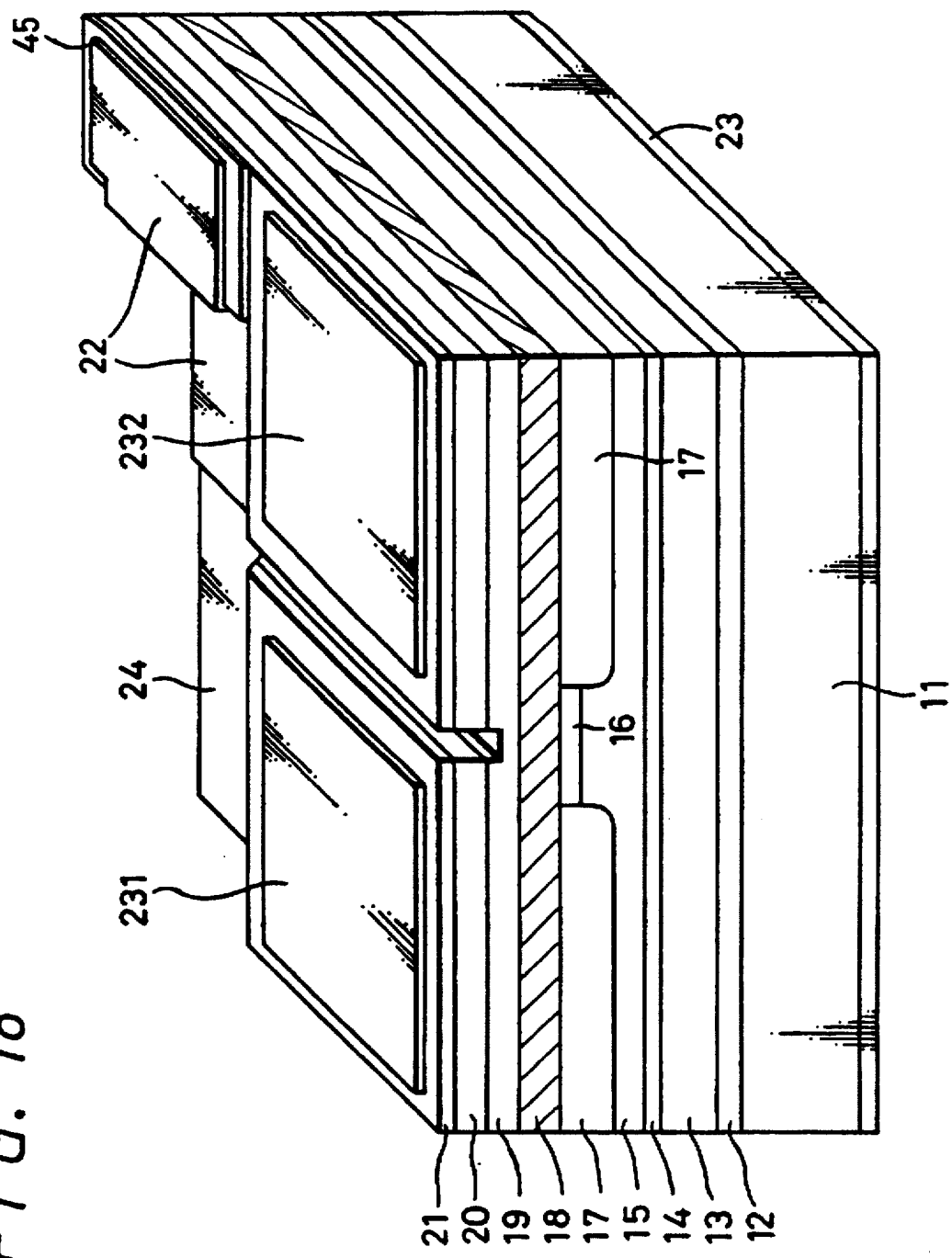
FIG. 18 is a perspective view illustrating a manner in which an electrode forming surface is formed so as to have a step and electrodes are deposited over the electrode forming surface with the step.

Further, as shown in FIG. 18, the selective growth mask formed of the insulating film 24 is removed from a part of the electrode forming portion and this portion is selectively grown to provide a step. Then, if the step is covered with the insulating film 24 and the p-side electrode 22 connected to the contact hole defined on the insulating film 24 is deposited on an insulating film 45, then it is possible to make the heights of the electrodes uniform.

The thus interconnected optical element is packaged and can be formed as the light-emitting portion and the light-receiving portion of the optical device.

Figure 19:
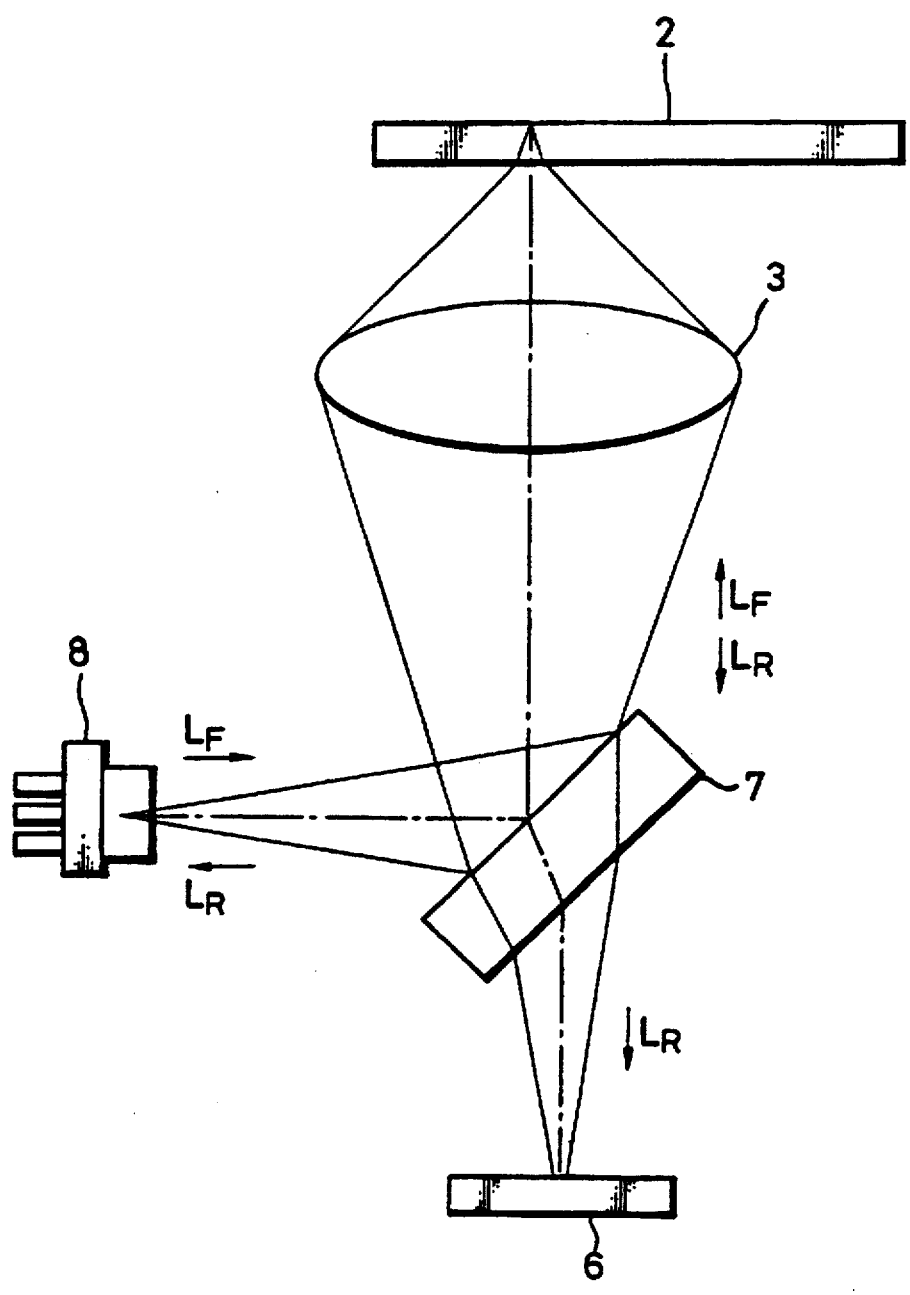
FIG. 19 is a schematic diagram showing an example of an optical pickup to which the optical device according to the present invention is applied.

FIG. 19 is a schematic diagram showing an example of an optical pickup to which the optical device according to the present invention is applied. As shown in FIG. 19, when the above-mentioned optical package is applied to the optical pickup of the optical disk, the optical pickup comprises a so-called optical package 8 in which the optical element 10 is sealed, a half mirror 7 and a second light-receiving portion 6. The second light-receiving portion 6 is such one that light-receiving elements such as photodiode are located so as to detect various signals.

In this optical device, emitted light $L_F$ is reflected on the half mirror 7 and reflected at an irradiated portion 2 through a converging means 3 to thereby produce returned light $L_R$. The returned light $L_R$ is separated by the half mirror 7 and received by the light-receiving portion 5 of CLC arrangement provided near the light-emitting portion 4 for detecting the tracking servo signal within the optical package 8 and the second light-receiving portion 6 for detecting an RF (high frequency) signal containing the focus servo signal and recorded information.

The light-receiving portion 5 detects a tracking servo signal based on the push-pull method and the second light-receiving portion 6 detects the focus servo signal and the RF signal based on an astigmatism method or the like.

If the optical pickup is arranged as shown in FIG. 19, then a diffraction grating used to detect a tracking servo signal by a so-called three beam spot becomes unnecessary so that light can reach the irradiated portion 2 highly efficiently and that stray light can be avoided.

When the optical devices according to the above-mentioned inventive examples are applied to an optical device for reading recorded information or writing information in an optical recording medium such as an optical disk, a phase-change optical disk or a magneto-optical disk, the optical device can stably detect a tracking servo signal highly efficiently.

The optical device according to the present invention can be applied to a light source and a detector of a confocal microscope which does not need focus servo.

The semiconductor material such as a substrate is not limited to the above-mentioned GaAs•AlGaAs material but AlGaInP, ZnSe and InP materials may be used.

Further, since light intensity distribution in the confocal optical system can be detected by a plurality of light-receiving portions, if the focus servo based on the astigmatism and the very small light-receiving portions are regarded as pin-hole or slit, then it is possible to provide a super-resolution.

If a part of edge of beam spot is detected, then detection of magneto-optical signal can be applied to the present invention (see Marc D. Levenson, APPLIED OPTICS, VOL. 30, No.2,10 (1991)).

A manner in which the optical device according to the present invention is applied to a so-called laser diode coupler will be described below.

Figures 20A, 20B:
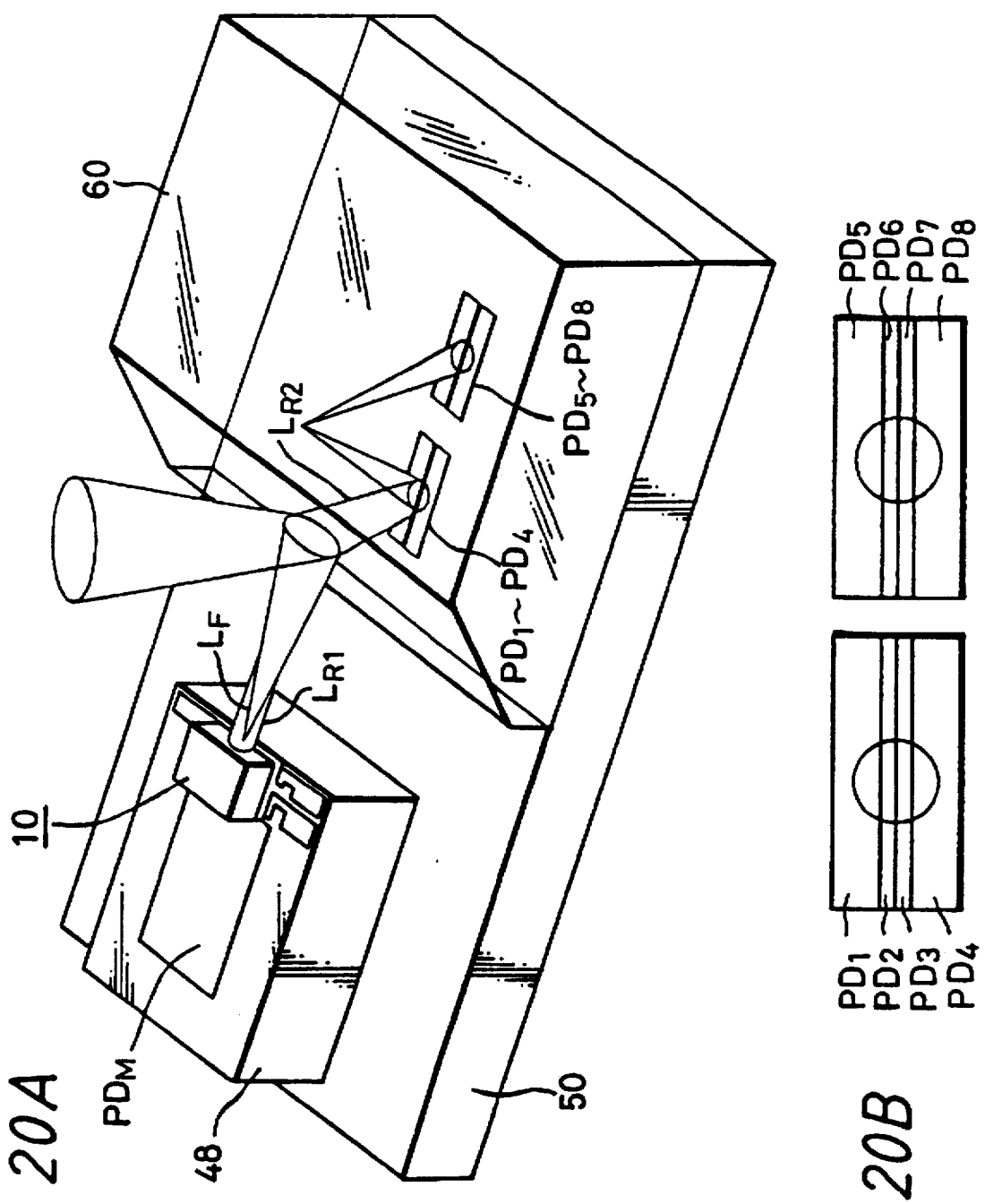
FIG. 20A is a schematic perspective view illustrating a manner in which the optical device according to the present invention is applied to a laser diode coupler.
FIG. 20B is a plan view illustrating a quadrant photodiode shown in FIG. 20A in an enlarged scale.

FIG. 20A is a perspective view illustrating a manner in which the optical device according to the present invention is applied to the laser diode coupler.

As shown in FIG. 20A, the optical element 10 mounted on the silicon substrate 48 shown in FIG. 16 is used as a light source and optical assemblies and a micro-prism 60 are disposed on a substrate, e.g., silicon substrate 50, thereby forming the laser diode coupler. Two quadrant photodiodes $PD_1$ to $PD_4$ and $PD_5$ to $PD_8$ are disposed under the micro-prism 60. The photodiodes $PD_1$ to $PD_8$ are formed on the surface of the silicon substrate 50 by some suitable method such as diffusion.

As shown by an enlarged plan view of FIG. 20B, the quadrant photodiodes $PD_1$ to $PD_4$ are disposed in such a manner that the photodiodes $PD_1$, $PD_2$ and the photodiodes $PD_3$, $PD_4$ are symmetrical to each other and that an amount of light received in the case of proper focusing and proper tracking is expressed as $PD_1+PD_4=PD_2+PD_3$. This is also true for the photodiodes $PD_5$ to $PD_8$.

In this laser diode coupler, light $L_F$ emitted from the semiconductor laser LD of the optical element 10 is reflected on the half-mirror inclined surface of 45° of the micro-prism 60, traveled in the vertical direction in FIG. 20A and irradiated on the irradiated portion, e.g., disk. A part $L_{R1}$ of returned light $L_R$ reflected on the disk is reflected on the half-mirror inclined surface of the micro-prism 60 and received at photodiodes $PD_9$, $PD_{10}$ (see FIG. 21) of the optical element 10. Another part $L_{R2}$ of the returned light $L_R$ is introduced into the micro-prism 60 from the half-mirror inclined surface and received and reflected on the quadrant photodiodes $PD_1$ to $PD_4$. Then, the reflected light is reflected on the upper surface of the micro-prism 60 and also received by the other quadrant photodiodes $PD_5$ to $PD_8$.

The ordinary laser diode coupler effects a tracking servo by using a signal of $|(PD_1+PD_2+PD_7+PD_8)-(PD_3+PD_4+PD_5+PD_6)|$ based on the push-pull method and also detects the focus signal and the RF signal by using the quadrant photodiodes $PD_1$ to $PD_4$ and $PD_5$ to $PD_8$. In this case, as mentioned before, there is then the defect that an offset occurs due to the displacement of disk and lens.

However, in the optical device shown in FIG. 20A, the tracking servo signal is detected by the light-emitting portion 4 and the light-receiving portion 5 with the CLC arrangement, thereby avoiding the offset from the confocal characteristic.

Figure 21:
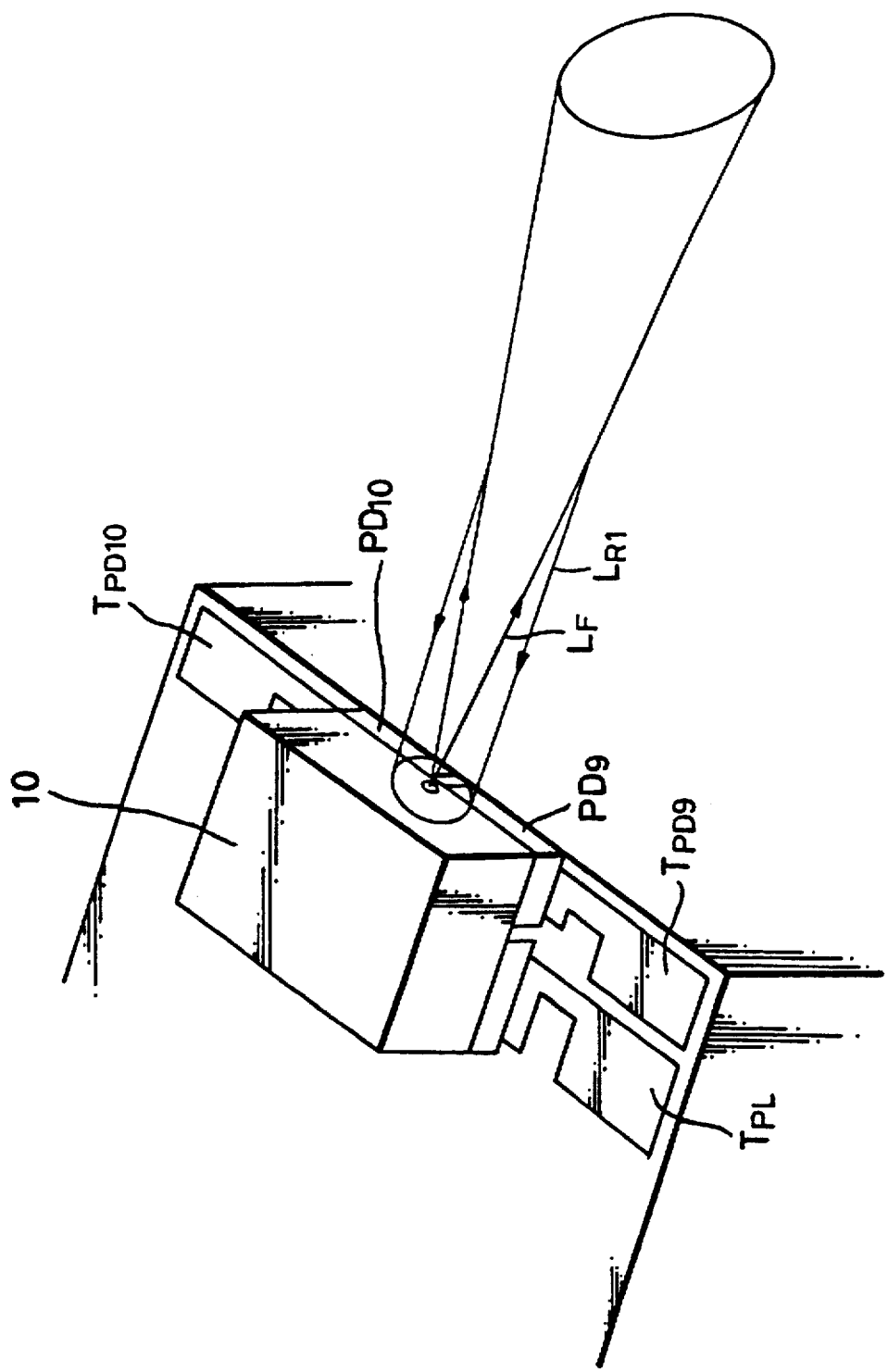
FIG. 21 is a perspective view illustrating a laser light source portion of the laser diode coupler shown in FIG. 20A in an enlarged scale.

FIG. 21 is a perspective view illustrating a light source portion of the laser diode coupler of FIG. 20A in an enlarged scale. As shown in FIG. 21, the optical element 10 comprises two photodiodes $PD_9$ and $PD_{10}$ disposed near the semiconductor laser LD, terminals $T_{PD9}$, $T_{PD10}$ connected to the photodiodes $PD_9$, $PD_{10}$ and an electrode terminal $T_L$ of the semiconductor laser LD. The returned light $L_{R1}$ is received at the two photodiodes $PD_9$ and $PD_{10}$, whereby the differential amplifier detects a difference signal of $(PD_{10}-PD_9)$ as a tracking servo detecting signal similarly to the aforesaid inventive examples.

The focus servo signal and the RF signal are detected by the quadrant photodiodes $PD_1$ to $PD_4$, $PD_5$ to $PD_8$ disposed within the micro-prism 60 similarly to the ordinary laser diode coupler.

The focus servo signal uses a signal of $[(PD_1+PD_4-PD_2-PD_3)-(PD_5+PD_8-PD_6-PD_7)]$ as a detecting signal.

The RF signal uses a signal of $(PD_1+PD_2+PD_3+PD_4+PD_5+PD_6+PD_7+PDB)$, i.e., a sum signal of all signals as a detecting signal.

With the above-mentioned arrangement, the laser diode coupler is able to detect various signals and to obtain a tracking servo signal without being affected by the offset.

A variety of optical disks such as compact disc, phase-change optical disk or magneto-optical disk can be applied to the irradiated portion 2 to which the optical device according to the present invention is applied.

According to the present invention, since the light-receiving portion is disposed near the confocal point of light returned to the light-emitting portion and the light-emitting portion and the light-receiving portion are formed on the same substrate, the whole of the optical device can be reduced in size and the number of optical assemblies can be decreased, thereby resulting in the optical device being miniaturized.

Since the emitted light and the returned light travel through the coaxial light path, the optical system can be simplified and the alignment can be adjusted with ease. In addition, as compared with the case that light is separated by a beam splitter or the like, a ratio of light returned to the light-receiving portion can be increased and hence an amount of light received at the light-receiving portion can be increased.

Accordingly, the same amount of light received can be realized by a lower laser output and the optical device has a low power consumption.

Since light is received near the confocal point of returned light, a tracking servo signal can be detected by the push-pull method more stably and accurately than the case using a far field pattern. Therefore, the tracking servo signal can be detected stably. At that time, if returned light is separated by a plurality of light-receiving portions, then a variety of signals such as focus servo signal can be detected and information amount of signals can be increased.

In the optical device according to the present invention, since the light-emitting portion need not be formed as a surface-emission structure, the optical device according to the present invention can be produced in a similar manner to that of the manufacturing process of the ordinary semiconductor laser structure and is advantageous in laser characteristic.

Further, a semiconductor laser structure and an optical system for an optical device can be designed with satisfactory allowance and freedom.

If the present invention is applied to the optical device using the optical disk, the phase-change optical disk and the magneto-optical disk as the optical recording medium, then a power consumption of the optical device according to the present invention can be decreased, the optical device according to the present invention can be miniaturized and the signal can be detected stably, i.e., reproduction and recording can be stabilized. Therefore, it is possible to realize the optical device of excellent performance.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. An optical device comprising:
   a substrate;
   a light-emitter on said substrate, said light-emitter comprising a first cladding layer of a first conductivity type on said substrate, an active layer on said first cladding layer, and a second cladding layer of a second conductivity type on said active layer;
   a light-receiver stacked over said light-emitter, said light-receiver comprising a first layer over said second cladding layer, a second layer on said first layer, said second layer being divided into two light-receiving elements;
   an isolation layer between said light-emitter and said light-receiver;
   wherein said light-emitter and said light-receiver have respective facets which form a continuous surface,
   a light emitted from said facet of said light-emitter is reflected onto a reflective object and a light reflected back therefrom is received at said facet of said light-receiver without being divided.

2. An optical device as claimed in claim 1, wherein said facet of said light-receiver is oriented on an oblique angle with respect to said facet of said light-emitter.

3. An optical device as claimed in claim 2, wherein said facet of said light-receiver has a (111) or (110) crystal plane.

4. An optical device as claimed in claim 1, wherein said light-receiver is configured to detect a signal having a push-pull method.

5. An optical device as claimed in claim 1, wherein said isolation layer is a light-absorption layer.

6. An optical device as claimed in claim 1, further comprising a current blocking layer disposed between said light-emitter and said light-receiver.

7. An optical device as claimed in claim 1, wherein at least a part of said light-receiver is disposed within a diffraction limit of said emitted light.

8. An optical device as claimed in claim 1, wherein said light receiver is configured to detect a tracking servo signal by comparing light received by said two light-receiving elements.

* * * * *